US011220438B2

(12) United States Patent
Yoshida et al.

(10) Patent No.: US 11,220,438 B2
(45) Date of Patent: Jan. 11, 2022

(54) NICKEL COBALT COMPLEX HYDROXIDE PARTICLES AND METHOD FOR PRODUCING THE SAME, POSITIVE ELECTRODE ACTIVE MATERIAL FOR NON-AQUEOUS ELECTROLYTE SECONDARY BATTERY AND METHOD FOR PRODUCING THE SAME, AND NON-AQUEOUS ELECTROLYTE SECONDARY BATTERY

(71) Applicant: NICHIA CORPORATION, Anan (JP)

(72) Inventors: Hideki Yoshida, Tokushima (JP); Masato Sonoo, Komatsushima (JP); Takahiro Kitagawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 185 days.

(21) Appl. No.: 16/410,726

(22) Filed: May 13, 2019

(65) Prior Publication Data
US 2019/0263675 A1 Aug. 29, 2019

Related U.S. Application Data

(62) Division of application No. 15/139,903, filed on Apr. 27, 2016, now Pat. No. 10,336,626.

(30) Foreign Application Priority Data

Apr. 28, 2015 (JP) .................................. 2015-092102
Apr. 11, 2016 (JP) .................................. 2016-079178

(51) Int. Cl.
C01G 53/04 (2006.01)
H01M 4/525 (2010.01)
(Continued)

(52) U.S. Cl.
CPC ......... *C01G 53/04* (2013.01); *C01G 45/1221* (2013.01); *C01G 51/006* (2013.01);
(Continued)

(58) Field of Classification Search
CPC .............. C01P 2004/03; C01P 2004/62; C01P 2002/85; C01P 2006/40; C01P 2004/10;
(Continued)

(56) References Cited

U.S. PATENT DOCUMENTS

2009/0104530 A1  4/2009  Shizuka et al.
2010/0099027 A1  4/2010  Kikuya et al.
(Continued)

FOREIGN PATENT DOCUMENTS

CN    102569775 A    7/2012
JP    2008-251532 A    10/2008
(Continued)

OTHER PUBLICATIONS

Extended European Search Report dated Nov. 7, 2016, in European Patent Application No. 16167299.3-1354.

*Primary Examiner* — Jonathan G Jelsma
*Assistant Examiner* — Omar M Kekia
(74) *Attorney, Agent, or Firm* — Hunton Andrews Kurth LLP

(57) ABSTRACT

A method for producing a nickel cobalt complex hydroxide includes first crystallization of supplying a solution containing Ni, Co and Mn, a complex ion forming agent and a basic solution separately and simultaneously to one reaction vessel to obtain nickel cobalt complex hydroxide particles, and a second crystallization of, after the first crystallization, further supplying a solution containing nickel, cobalt, and manganese, a solution of a complex ion forming agent, a basic solution, and a solution containing said element M separately and simultaneously to the reaction vessel to
(Continued)

crystallize a complex hydroxide particles containing nickel, cobalt, manganese and said element M on the nickel cobalt complex hydroxide particles crystallizing a complex hydroxide particles comprising Ni, Co, Mn and the element M on the nickel cobalt complex hydroxide particles.

5 Claims, 17 Drawing Sheets

(51) Int. Cl.
| | |
|---|---|
| H01M 4/505 | (2010.01) |
| C30B 7/14 | (2006.01) |
| C30B 29/10 | (2006.01) |
| C30B 1/10 | (2006.01) |
| C30B 29/22 | (2006.01) |
| C30B 29/68 | (2006.01) |
| C01G 45/12 | (2006.01) |
| C01G 51/00 | (2006.01) |
| C01G 51/04 | (2006.01) |
| C01G 53/00 | (2006.01) |
| H01M 4/133 | (2010.01) |
| H01M 10/0525 | (2010.01) |
| H01M 4/1391 | (2010.01) |
| H01M 4/04 | (2006.01) |

(52) U.S. Cl.
CPC ............ *C01G 51/04* (2013.01); *C01G 51/42* (2013.01); *C01G 53/006* (2013.01); *C01G 53/42* (2013.01); *C01G 53/50* (2013.01); *C30B 1/10* (2013.01); *C30B 7/14* (2013.01); *C30B 29/10* (2013.01); *C30B 29/22* (2013.01); *C30B 29/68* (2013.01); *H01M 4/505* (2013.01); *H01M 4/525* (2013.01); *C01P 2002/54* (2013.01); *C01P 2002/85* (2013.01); *C01P 2004/03* (2013.01); *C01P 2004/10* (2013.01); *C01P 2004/20* (2013.01); *C01P 2004/50* (2013.01); *C01P 2004/61* (2013.01); *C01P 2004/62* (2013.01); *C01P 2006/40* (2013.01); *H01M 4/0435* (2013.01); *H01M 4/133* (2013.01); *H01M 4/1391* (2013.01); *H01M 10/0525* (2013.01)

(58) Field of Classification Search
CPC .............. C01P 2004/61; C01P 2002/54; C01P 2004/20; C01P 2004/50; C01G 45/1221; C01G 51/04; C01G 53/04; C01G 53/50; C01G 53/42; C01G 51/006; C01G 51/42; C01G 53/006; C30B 29/68; C30B 29/10; C30B 29/22; C30B 7/14; C30B 1/10; H01M 4/133; H01M 4/0435; H01M 4/505; H01M 10/0525; H01M 4/525; H01M 4/1391; Y02E 60/10
USPC ........................................................ 429/223
See application file for complete search history.

(56) References Cited

U.S. PATENT DOCUMENTS

| | | | |
|---|---|---|---|
| 2012/0270107 | A1 | 10/2012 | Toya et al. |
| 2013/0078520 | A1 | 3/2013 | Toya et al. |
| 2013/0146808 | A1 | 6/2013 | Endo et al. |
| 2013/0288129 | A1 | 10/2013 | Toya et al. |
| 2014/0186710 | A1 | 7/2014 | Ryoshi et al. |
| 2014/0306151 | A1 | 10/2014 | Daisuke |
| 2014/0377660 | A1 | 12/2014 | Fukui et al. |
| 2015/0037676 | A1 | 2/2015 | Yamauchi et al. |
| 2015/0228977 | A1 | 8/2015 | Toya et al. |
| 2016/0172674 | A1 | 6/2016 | Ods et al. |
| 2016/0268605 | A1 | 9/2016 | Yamauchi et al. |

FOREIGN PATENT DOCUMENTS

| | | |
|---|---|---|
| JP | 2008-305777 A | 12/2008 |
| JP | 2011-116580 A | 6/2011 |
| JP | 2012-254889 A | 12/2012 |
| JP | 2012-256435 A | 12/2012 |
| JP | 2013-147416 A | 8/2013 |
| JP | 2013-222693 A | 10/2013 |
| WO | 2013/125703 A1 | 8/2013 |
| WO | 2015/012283 A1 | 1/2015 |

NICKEL COBALT COMPLEX HYDROXIDE PARTICLES AND METHOD FOR PRODUCING THE SAME, POSITIVE ELECTRODE ACTIVE MATERIAL FOR NON-AQUEOUS ELECTROLYTE SECONDARY BATTERY AND METHOD FOR PRODUCING THE SAME, AND NON-AQUEOUS ELECTROLYTE SECONDARY BATTERY

CROSS REFERENCE TO RELATED APPLICATION

This is a divisional application of U.S. patent application Ser. No. 15/139,903, filed Apr. 27, 2016, which claims priority under 35 U.S.C. § 119 to Japanese Patent Application No. 2015-092102, filed Apr. 28, 2015 and Japanese Patent Application No. 2016-079178, filed Apr. 11, 2016.

BACKGROUND

Technical Field

The present disclosure relates to nickel cobalt complex hydroxide particles which are raw materials of a positive electrode active material for non-aqueous electrolyte secondary battery and a method for producing the same, a positive electrode active material for non-aqueous electrolyte secondary battery for which the nickel cobalt complex hydroxide particles are raw materials and a method for producing the same, and a non-aqueous electrolyte secondary battery for which the positive electrode active material for non-aqueous electrolyte secondary battery is used as a positive electrode material.

Description of Related Art

With miniaturization and increasing demand of electronic devices such as mobile phone and VTR in recent years, a secondary battery that is an electric power source for these electronic devices is required to have higher energy. A non-aqueous electrolyte secondary battery such as lithium ion secondary battery is expected to serve as such a secondary battery. As a positive electrode active material for the lithium ion secondary battery, one or more lithium transition metal complex oxides having a layered structure, such as lithium cobalt oxide, lithium nickel oxide, and lithium nickel cobalt manganese oxide have been used.

Patent Literature 1 (JP2008-305777A) describes a technique in which, in order to suppress excessive grain growth and sintering during calcination, one or more additive agents are added in a range of 0.01 mol % to less than 2 mol % with respect to the total molar amount of transition metal elements in a raw material of a main component, then, calcination is carried out. With this technique, while obtaining sufficient crystallinity in the step of calcinating the active material, excessive growth of particles and excessive sintering can be suppressed by the additive elements on the surfaces of secondary particles, so that fine particles can be obtained. The method described in Patent Literature 1 (JP2008-305777A) includes pulverizing and mixing the raw materials of the main component simultaneously in a liquid medium, then, spray-drying the obtained slurry, followed by calcination.

On the other hand, there is a coprecipitation method as a method for producing a nickel cobalt complex hydroxide particles which is a precursor of lithium transition metal complex oxide and is used as a raw material for the above-mentioned lithium transition metal complex oxide.

Patent Literature 2 describes that an additive element is coprecipitated with main component in a seed growth step or a particle growth step for obtaining a nickel cobalt manganese complex hydroxide particles so that the additive element is homogeneously distributed inside a secondary particles or covers the surface of the secondary particles.

CITATION LIST

Patent Literature

Patent Literature 1: JP 2008-305777 A
Patent Literature 2: JP 2012-254889 A

SUMMARY

The present disclosure provides a positive electrode active material for non-aqueous electrolyte secondary battery having good low-temperature output power characteristics and high discharge capacity, and a method for producing the same, and a nickel cobalt complex hydroxide which is a raw material for the positive electrode active material, and a method for producing the same.

According to certain embodiments of the present disclosure, a method for producing a nickel cobalt complex hydroxide represented by a formula $Ni_{1-x-y}Co_xMn_yM_z(OH)_{2+a}$ in which $0.10 \leq x \leq 0.35$, $0 < y \leq 0.35$, $0 < z \leq 0.05$, and $0 \leq a \leq 0.5$, M is at least one element selected from a group consisting of Al, Mg, Ca, Ti, Zr, Nb, Ta, Cr, Mo, W, Fe, Cu, Si, Sn, Bi, Ga, Y, Sm, Er, Ce, Nd, La, Cd and Lu is provided. The method includes a first crystallization and a second crystallization. The first crystallization includes supplying a solution containing nickel, cobalt and manganese, a solution of a complex ion forming agent, and a basic solution, separately and simultaneously, to one reaction vessel to obtain nickel cobalt complex hydroxide particles.

The second crystallization includes, after the first crystallization, further supplying the solution containing nickel, cobalt, manganese, the solution of the complex ion forming agent, the basic solution, and a solution containing the element M, separately and simultaneously to the reaction vessel to crystallize particles of complex hydroxide particles containing nickel, cobalt, manganese, and the element M on the complex hydroxide particles. Assuming that total molar amount of nickel, cobalt and manganese supplied in the step of first crystallization is MOL(1) and that total molar amount of nickel, cobalt and manganese supplied in the step of second crystallization is MOL(2), MOL(1) and MOL(2) satisfy an inequality of $0.30 \leq MOL(1)/\{MOL(1)+MOL(2)\} < 0.95$.

According to certain embodiments of the present disclosure, a method for producing a nickel cobalt complex hydroxide represented by a formula: $Ni_{1-x}Co_xM_z(OH)_{2+a}$, in which $0.10 \leq x \leq 0.35$, $0 < z \leq 0.05$, $0 \leq a \leq 0.5$, M is at least one element selected from a group consisting of Al, Mg, Ca, Ti, Zr, Nb, Ta, Cr, Mo, W, Fe, Cu, Si, Sn, Bi, Ga, Y, Sm, Er, Ce, Nd, La, Cd and Lu is provided. The method includes a first crystallization and a second crystallization. The first crystallization includes supplying a solution containing nickel and cobalt, a solution of a complex ion forming agent, and a basic solution, separately and simultaneously to one reaction vessel to obtain nickel cobalt complex hydroxide particles.

The second crystallization includes, after the first crystallization, further supplying the solution containing nickel and cobalt, the solution of the complex ion forming agent, the basic solution, and a solution containing the element M, separately and simultaneously to the reaction vessel to crystallize particles of complex hydroxide particles containing nickel, cobalt, manganese, and the element M on the complex hydroxide particles.

Assuming that total molar amount of nickel and cobalt supplied in the step of first crystallization is MOL(1) and that total molar amount of nickel and cobalt supplied in the step of second crystallization is MOL(2), MOL(1) and MOL(2) satisfy an inequality of $0.30 \leq MOL(1)/\{MOL(1)+MOL(2)\}<0.95$.

A nickel cobalt complex hydroxide according to certain embodiments of the present disclosure is represented by a formula: $Ni_{1-x-y}Co_xMn_yM_z(OH)_{2+a}$, in which $0.10 \leq x \leq 0.35$, $0 \leq y \leq 0.35$, $0<z \leq 0.05$, $0 \leq a \leq 0.5$, M is at least one element selected from a group consisting of Al, Mg, Ca, Ti, Zr, Nb, Ta, Cr, Mo, W, Fe, Cu, Si, Sn, Bi, Ga, Y, Sm, Er, Ce, Nd, La, Cd and Lu. The nickel cobalt complex hydroxide is in a form of secondary particles formed by aggregation of primary particles. The secondary particles are made of a first layer, a second layer, and a third layer. The first layer has a radial depth ratio of less than 5% from a surface in the secondary particles. The second layer has a radial depth ratio in a range of from 5% to less than 50% and located at an inner side than the first layer in the secondary particles. The third layer has a radial depth ratio of 50% or greater and located at an inner side than the second layer in the secondary particles. Further, a SEM-EDX spectrum of the element M with respect to the radial depth in the secondary particles has a peak in the second layer.

A positive electrode active material according to certain embodiments of the present disclosure is a positive electrode active material for non-aqueous electrolyte secondary battery comprising a lithium transition metal complex oxide represented by a formula: $Li_aNi_{1-x-y}Co_xMn_yM_zO_2$, in which $0.955 \leq a \leq 1.2$, $0.10 \leq x \leq 0.35$, $0 \leq y \leq 0.35$, $0<z \leq 0.05$, M is at least one element selected from a group consisting of Al, Mg, Ca, Ti, Zr, Nb, Ta, Cr, Mo, W, Fe, Cu, Si, Sn, Bi, Ga, Y, Sm, Er, Ce, Nd, La, Cd and Lu. The lithium transition metal complex oxide is in a form of secondary particles formed by aggregation of primary particles. The secondary particles are made of a first layer, a second layer, and a third layer. The first layer has a radial depth ratio of less than 5% from a surface in the secondary particles. The second layer has a radial depth ratio of in a range of 5% to less than 50% and at an inner side than the first layer in the secondary particles. The third layer has a radial depth ratio of 50% or greater and located at an inner side than the second layer in the secondary particles. Further, a SEM-EDX spectrum of the element M with respect to the depth of the secondary particles has a peak in the second layer.

A non-aqueous electrolytic solution secondary battery according to certain embodiments of the present disclosure includes a positive electrode, a negative electrode, a separator, and a non-aqueous electrolytic solution, in which the positive electrode includes the positive electrode active material according to certain embodiments of the present disclosure.

A solid electrolyte secondary battery according to certain embodiments of the present disclosure includes a positive electrode, a negative electrode, and a solid electrolyte, in which the positive electrode includes the positive electrode active material according to certain embodiments of the present disclosure.

According to the present disclosure, a positive electrode active material for non-aqueous electrolyte secondary battery and a nickel cobalt complex hydroxide which is a raw material for the positive electrode active material can be provided in an industrial scale. Moreover, with the use of the positive electrode active material, a non-aqueous electrolyte secondary battery that has battery characteristics of a high low-temperature output characteristics and a high discharge capacity can be obtained.

DETAILED DESCRIPTION OF EMBODIMENTS

Figure 1:
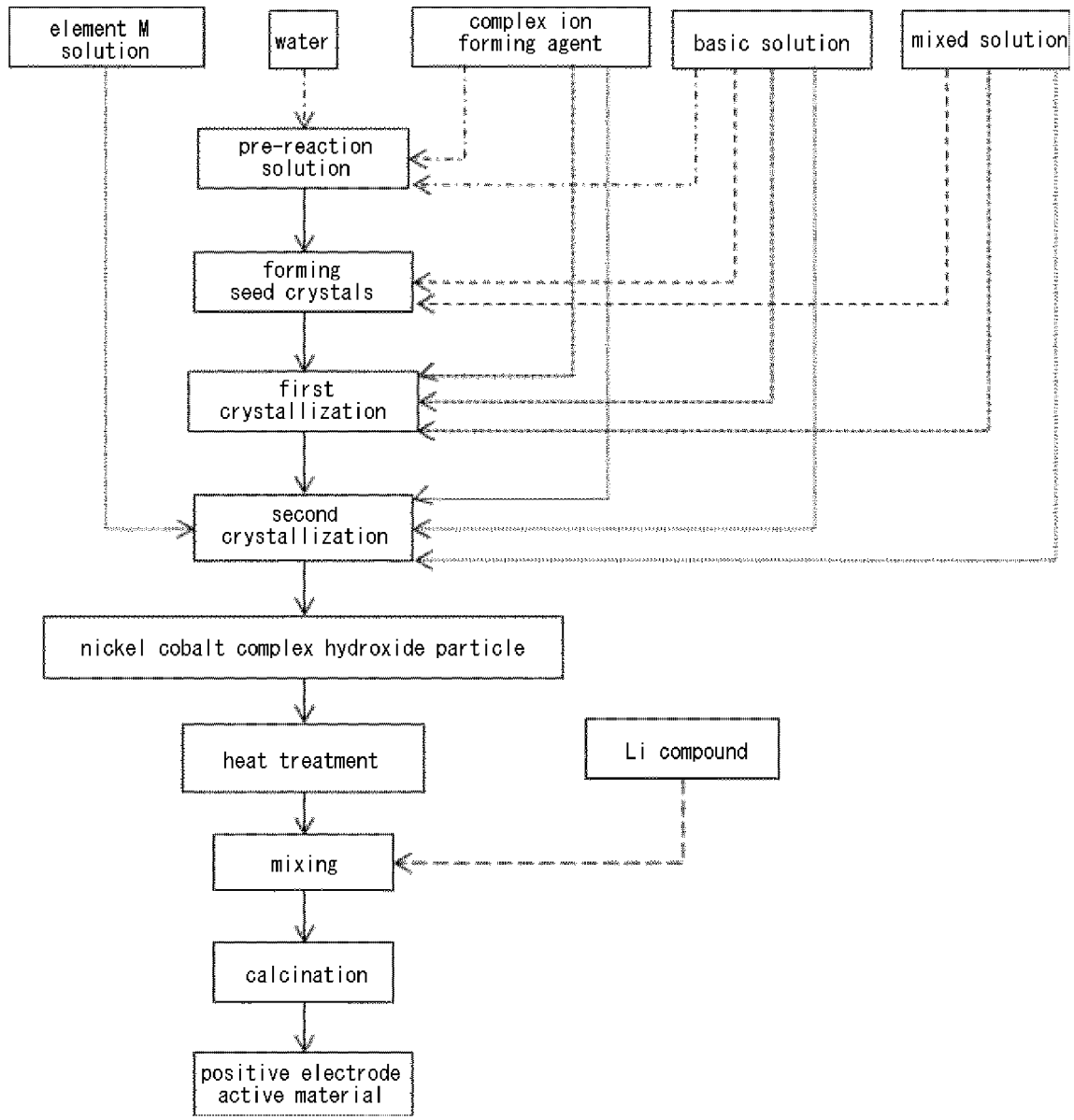
FIG. 1 is an overview flow chart of steps for producing a positive electrode active material having a solid structure according to the present disclosure.
Figure 2:
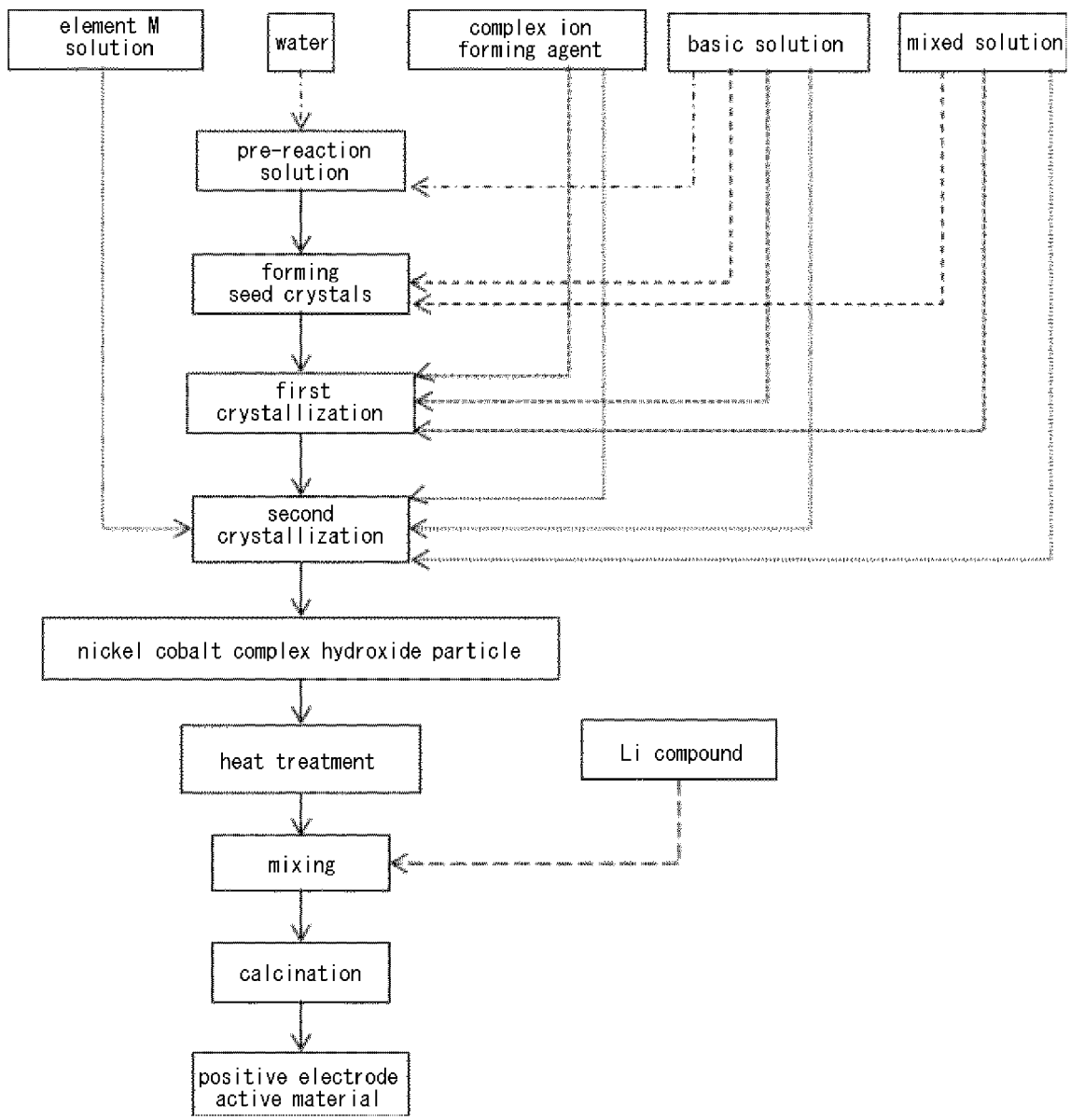
FIG. 2 is an overview flow chart of steps for producing a positive electrode active material having a hollow structure according to the present disclosure.

The present disclosure relates to a nickel cobalt complex hydroxide which is a precursor of a positive electrode active material for non-aqueous electrolyte secondary battery and a method for producing the same as exemplified in FIG. 1 and FIG. 2. In addition, the present disclosure relates to a positive electrode active material for non-aqueous electrolyte secondary battery for which the nickel cobalt complex hydroxide is used as a raw material and a method for producing the same, and a non-aqueous electrolyte secondary battery in which the positive electrode active material is used for a positive electrode.

Method of Producing Nickel Cobalt Complex Hydroxide Particles

The method for producing the nickel cobalt complex hydroxide according to the present disclosure is a method for producing the complex hydroxide by a crystallization reaction, the method can include a first crystallization in that a solution including nickel, cobalt and manganese, a solution of a complex ion forming agent, and a basic solution are supplied separately and simultaneously to one reaction vessel to obtain nickel cobalt complex hydroxide particles, and a second crystallization in that after the first crystallization, the solution containing nickel, cobalt and manganese, the solution of the complex ion forming agent, the basic solution, and a solution containing the element M are further separately and simultaneously supplied to the reaction vessel to crystallize complex hydroxide particles containing nickel, cobalt, manganese, and the element M on the nickel cobalt complex hydroxide particles. Alternatively, the method for producing the nickel cobalt complex hydroxide according to the present disclosure can include a first crystallization in that a solution containing nickel and cobalt, a solution of a complex ion forming agent, and a basic solution are supplied separately and simultaneously to one reaction vessel to obtain nickel cobalt complex hydroxide particles and a second crystallization in that after the first crystallization, the solution containing nickel and cobalt, the solution of the complex ion forming agent, the basic solution, and a solution containing the element M are further separately and simultaneously supplied to the reaction vessel to crystallize complex hydroxide particles containing nickel, cobalt, and the element M on the nickel cobalt complex hydroxide particles. Hereinafter, for ease of explanation, the solution containing nickel, cobalt and manganese and the solution containing nickel and cobalt may be collectively simply referred to as "the solution such as the solution containing nickel, cobalt and manganese" or "mixed solution".

Examples of a metal source for the solution such as the solution containing nickel, cobalt and manganese include nitrates, sulfates, hydrochlorides, and the like. The solution such as the solution containing nickel, cobalt and manganese is a mixed solution of a plurality of solutions each containing such a metal source with respect to the target. It is preferable that those solutions are adjusted to 25° C. or more.

In the case of mixing the solutions containing such metal sources to prepare the mixed solution, the concentration of the mixed solution is preferably in a range of 1.0 to 2.6 mol/L, more preferably in a range of 1.5 to 2.2 mol/L, as a total of the metal elements. In a case where the concentration of the mixed solution is less than 1.0 mol/L, the amount of the crystallized substance per reaction vessel decreases, so that the productivity may decrease. On the other hand, in a case where the concentration of the mixed solution exceeds 2.6 mol/L, it exceeds a saturated concentration at room temperature and crystals are reprecipitated, resulting in a decrease in the concentration of the solution.

Examples of the complex ion forming agent include acetic acid and citric acid which form a chelate complex with nickel, cobalt and manganese, in addition to an ammonium ion supplying source. Examples of the basic solution include sodium hydroxide solution.

Examples of a metal source of the element M include aluminum sulfate, sodium aluminate, aluminum nitrate, aluminum chloride, magnesium sulfate, magnesium chloride, magnesium nitrate, magnesium perchlorate, calcium chloride, calcium nitrate, calcium perchlorate, barium chloride, barium nitrate, strontium chloride, strontium nitrate, titanyl sulfate, titanium potassium oxalate, zirconium sulfate, zirconium nitrate, zirconium oxychloride, niobium oxalate, niobium complex solution, tantalum complex solution, chromium sulfate, potassium chromate, sodium molybdate, ammonium molybdate, sodium tungstate, ammonium tungstate, iron sulfate, iron chloride, iron nitrate, iron citrate, copper sulfate, copper nitrate, copper chloride, sodium silicate, tin sulfate, tin chloride, bismuth oxychloride, bismuth sulfate, gallium sulfate, gallium nitrate, gallium ammonium sulfate, yttrium sulfate, yttrium chloride, yttrium nitrate, samarium sulfate, samarium chloride, samarium nitrate, samarium oxalate, erbium sulfate, erbium chloride, erbium nitrate, cerium chloride, cerium ammonium nitrate, neodymium sulfate, neodymium chloride, neodymium nitrate, lanthanum sulfate, lanthanum chloride, lanthanum nitrate, gadolinium sulfate, gadolinium chloride, gadolinium nitrate, lutetium sulfate, lutetium chloride, and lutetium nitrate.

Forming Seed Crystals (Nuclei)

The method according to the present disclosure preferably includes a step of forming seed crystals before the step of first crystallization. FIG. 1 illustrates an example in which a pre-reaction solution used in the step of forming seed crystals contains a complex ion forming agent. First, as a pre-reaction solution, a solution containing a complex ion forming agent and a basic solution are placed in the reaction vessel. Next, in the step of forming seed crystals, the mixed solution and the basic solution are supplied in the pre-reaction solution to obtain the nickel cobalt complex hydroxide. In the present specification, the term "solution containing the complex ion forming agent" refers to, for example, a solution having an ammonium ion concentration of 0.5% or greater, in a case where the complex ion forming agent is ammonium ion, although the required amount varies depending on the type of the complex ion forming agent.

FIG. 2 illustrates an example in which the pre-reaction solution used in the step of forming seed crystals substantially does not contain any complex ion forming agent. First, a solution does not contain any complex ion forming agent and the basic solution are placed in the reaction vessel as the pre-reaction solution. Next, in the step of forming seed crystals, the mixed solution and the basic solution are supplied in the pre-reaction solution to obtain the nickel cobalt complex hydroxide. In the present specification, the term "solution substantially does not contain complex ion forming agent" refers to, for example, in the case where the complex ion forming agent is ammonium ion, a solution having an ammonium ion concentration of 500 ppm or less is preferable, and 100 ppm or less is further preferable, although the required amount varies depending on the type of the complex ion forming agent.

In the step of forming seed crystals, for example, in a case where the complex ion forming agent is ammonium ion, the complex ion forming agent is preferably supplied so that 2000 ppm or greater of ammonium ion is contained in a reaction liquid, although the required amount varies depending on the type of the complex ion forming agent.

The step of forming seed crystals is preferably carried out with solutions at 25° C. or greater and with supplying the basic solution so that the pH value of the reaction solution at 25° C. to be in a range of 9.5 to 12.0.

The crystallization time in the step of forming seed crystals is appropriately selected based on such as the particle diameter of the target nickel cobalt complex hydroxide, but the step of forming seed crystals is preferably carried out in a time duration in the range of 20 seconds to 10 minutes. In a case where the step of forming seed crystals is carried out for less than 20 seconds, sufficient amount of seed crystals cannot be formed. In a case where the step of forming seed crystals exceeds 10 minutes, an excessive amount of the seed crystal are formed, which may aggregate and may results in variations in particle size distribution.

After completing the step of forming seed crystals, it is preferable to start the first crystallization after adjusting pH value of the solution to a range of 9.5 to 12.0.

First Crystallization

In the step of first crystallization, the mixed solution, the solution of the complex ion forming agent, and the basic solution are separately and simultaneously to the solution after completing the step of forming seed crystals to obtain the nickel cobalt complex hydroxide particles.

Supplying of the complex ion forming agent in the step of first crystallization is preferably carried out, for example, in the case where the complex ion forming agent is ammonium ion, so that 2000 ppm or greater of the complex ion forming agent is contained in the reaction solution, although the required amount varies depending on the type of the complex ion forming agent.

In the step of first crystallization, a liquid temperature of the solution and pH value are preferably controlled such that the liquid temperature of the solution is 25° C. or more and such that the pH value measured on the basis of the liquid temperature of 25° C. is from 9.5 to 12.0 by supplying the basic solution.

Second Crystallization

In the step of second crystallization, the nickel cobalt complex hydroxide particles can be obtained by supplying the mixed solution, the solution containing the element M, the complex ion forming agent and the basic solution to the solution after completing the step of first crystallization.

Supplying of the complex ion forming agent in the step of second crystallization is preferably carried out such that 2000 ppm or more of the complex ion forming agent is contained in the reaction liquid, for example, in a case where the complex ion forming agent is ammonium ion, although the required amount varies depending on the type of the complex ion forming agent.

Assuming that total molar amount of nickel, cobalt and manganese supplied in the step of first crystallization is MOL(1) and that total molar amount of nickel, cobalt and manganese supplied in the step of second crystallization is MOL(2) in a case of supplying the solution containing nickel, cobalt and manganese, and assuming that total molar amount of nickel and cobalt supplied in the step of first crystallization is MOL(1) and that total molar amount of nickel and cobalt supplied in the step of second crystallization is MOL(2) in a case of supplying the solution containing nickel and cobalt, MOL(1) and MOL(2) satisfy an inequality of $0.30 \leq MOL(1)/\{MOL(1)+MOL(2)\}<0.95$. Furthermore, MOL(1) and MOL(2) preferably satisfy an inequality of $0.60 \leq MOL(1)/\{MOL(1)+MOL(2)\leq\}0.90$.

In a case where $\{MOL(1)/\{MOL(1)+MOL(2)\}$ is less than 0.3, the distribution of the element M is homogeneous inside the secondary particles of the complex hydroxide. In a case where $\{MOL(1)/\{MOL(1)+MOL(2)\}$ is 0.95 or more, the element M is in a state of covering the surface.

The solution containing the element M may be mixed and supplied with the mixed solution. However, the solution containing the element M is preferably supplied separately. A supply rate during the step of second crystallization is set appropriately to be constant on the basis of the supply volume and a time for the step of second crystallization.

Since the mixed solution and the solution containing the element M are supplied simultaneously and coprecipitated in the step of second crystallization, the element M is relatively homogeneously dispersed inside the primary particles of the nickel cobalt complex hydroxide particles obtained in the step of second crystallization. Also, the element M is homogeneously dispersed inside a primary particles in a positive electrode active material for which the hydroxide is used as a raw material. However, the element M is segregated outside the primary particles in a case where the nickel cobalt complex hydroxide and the element M are dry-mixed or in a case where the nickel cobalt complex hydroxide is covered with the element M.

In the step of second crystallization, the solution is preferably controlled to have a liquid temperature of 25° C. or more and pH value of from 9.5 to 12.0 measured on the basis of the liquid temperature of 25° C. by use of the basic solution. The supplying of the basic solution is carried out appropriately to maintain the pH value of the solution within the range.

Crystallization time in the step of first crystallization and the step of second crystallization are appropriately selected on the basis of a particle diameter of the target complex hydroxide and the like. However, the crystallization time is preferably 3 hours or more in light of control of the particle diameter. In the case of less than 3 hours, the control of the particle diameter is difficult since a time required for particle growth is insufficient.

It is preferable to control an oxygen concentration within the reaction vessel to 10% by volume or less in the step of forming seed crystals, the step of first crystallization and the step of second crystallization.

Nickel Cobalt Complex Hydroxide

A composition of the nickel cobalt complex hydroxide according to the present disclosure is represented by a formula described below. Formula: $Ni_{1-x-y}Co_xMn_yM_z(OH)_{2+a}$, wherein $0.10 \leq x \leq 0.35$, $0 \leq y \leq 0.35$, $0 < z \leq 0.05$, $0 \leq a \leq 0.5$, M is at least one element selected from a group consisting of Al, Mg, Ca, Ti, Zr, Nb, Ta, Cr, Mo, W, Fe, Cu, Si, Sn, Bi, Ga, Y, Sm, Er, Ce, Nd, La, Cd and Lu.

The nickel cobalt complex hydroxide is in a shape of secondary particles formed by aggregation of primary particles. The secondary particles are made of a first layer having a radial depth ratio of less than 5% from the surface in the secondary particles, a second layer having a radial depth ratio in a range of 5% to less than 50% and located at an inner side than the first layer in the secondary particles, and a third layer having a radial depth ratio of 50% or greater and located at an inner side than the second layer in the secondary particles. A SEM-EDX spectrum of the element M in the secondary particles in the depth direction has a peak in the second layer. An accelerating voltage when measuring the SEM-EDX is set to 10 kV.

The nickel cobalt complex hydroxide is dispersed in an epoxy resin and solidified. Subsequently, a cross-section of the secondary particles is formed by a cross-section polisher. Distribution of the element M inside the secondary particles can be determined by a line analysis of the cross-section with EDX.

When a CPS curve of the element M is determined by the line analysis, a specific peak as described below appears.

In the present specification, "CPS curve" is a plot of a depth ratio in the radial direction to the radius of the secondary particles of the nickel cobalt complex hydroxide on the horizontal axis and fluorescent X-ray intensity at that ratio (which indicates how much fluorescent X-ray having certain energy is detected, and is represented by a unit of CPS) on the vertical axis. The CPS curve is usually represented as a graph connecting the plotted points. The fluorescent X-ray intensity is represented by relative difference from the intensity at a starting point for measuring the secondary particles assuming that the intensity at the starting point for measuring the secondary particles is zero.

The peak means a peak that includes a point of maximum coordinate value on the vertical axis among peaks in the CPS curve.

Assuming that the amount of the element M in the first layer of the nickel cobalt complex hydroxide is S1, that the amount of the element M in the second layer is S2 and that the amount of the element M in the third layer is S3, the amounts of S1, S2 and S3 can be evaluated as described below.

Figure 5:
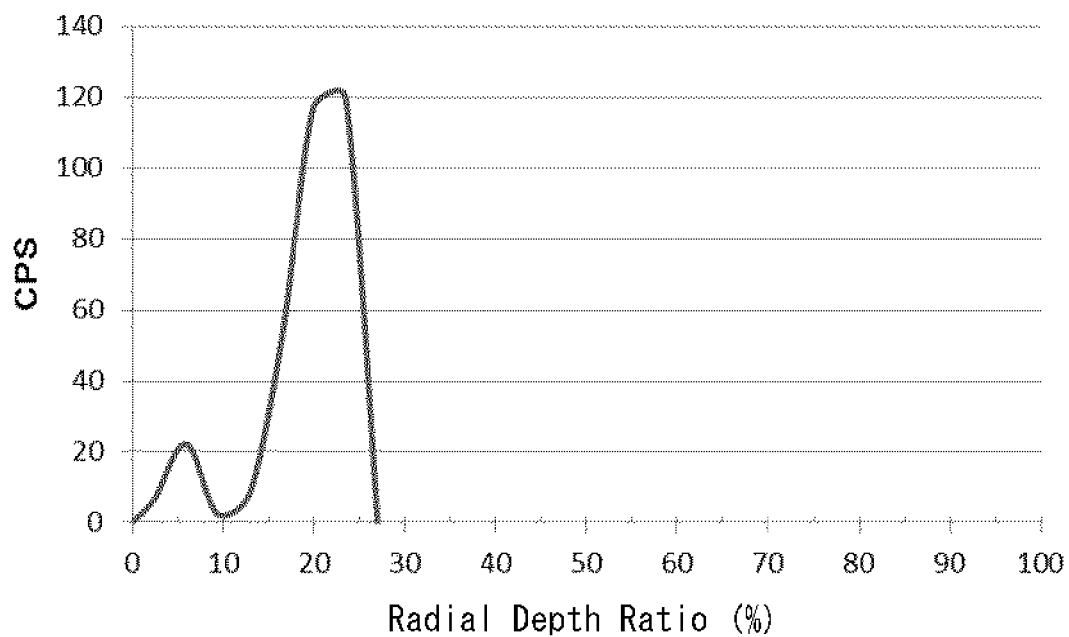
FIG. 5 is a CPS curve of the nickel cobalt complex hydroxide of Example 1.

The CPS curve shown in FIG. 5 and the like looks like a single curve. Actually, however, there are a number of plots. In the CPS curve, the product of a distance between each plot and a coordinate value on the vertical axis is determined as an area between each plot. An average value of an area between each plot corresponding to the first layer is defined as S1, an average value of an area between each plot corresponding to the second layer is defined as S2 and an average value of an area between each plot corresponding to the third layer is defined as S3.

The relation between the S1 and the S2 preferably satisfies an inequality of S2>1.02 S1. In the case of S2<1.02 S1, a distribution of the element M in the first layer and the second layer of the complex hydroxide is homogeneous or the element M is more distributed in the first layer.

The relation between the S2 and the S3 preferably satisfies an inequality of S2>1.02 S3. In the case of S2<1.02 S3, a distribution of the element M in the second layer and the third layer of the complex hydroxide is homogeneous, or the element M is more distributed in the third layer.

An average particle diameter of the secondary particles of the nickel cobalt complex hydroxide is preferably adjusted to from 1 to 20 μm. Furthermore, the average particle diameter is preferably adjusted to from 2 to 7 μm. The value of the average particle diameter is adjusted by the total of the molar amounts (MOL(1)+MOL(2)) in the step of first crystallization and the step of second crystallization.

The average particle diameter of the secondary particles and the shape and the average particle diameter of the primary particles of the nickel cobalt complex hydroxide can be confirmed by observation of the nickel cobalt complex hydroxide with SEM. Furthermore, the structure inside the secondary particles of the nickel cobalt complex hydroxide can be confirmed by observation of the secondary particles of the nickel cobalt complex hydroxide with cross-sectional SEM.

In the case where the pre-reaction solution substantially does not contain the complex ion forming agent in the step of forming seed crystals, a secondary particles of a nickel cobalt complex hydroxide obtained after the step of second crystallization has an inner core part comprising a fine primary particles having an average particle diameter of from 0.01 to 0.3 μm. The secondary particles also has an outer shell part outside the inner core part, the outer shell part comprising plate-like or needle-like primary particles larger than the fine primary particles and having an average particle diameter of from 0.5 to 2 μm. Furthermore, a lithium transition metal oxide for which the nickel cobalt complex hydroxide is used as a raw material has a hollow structure.

Figure 3:
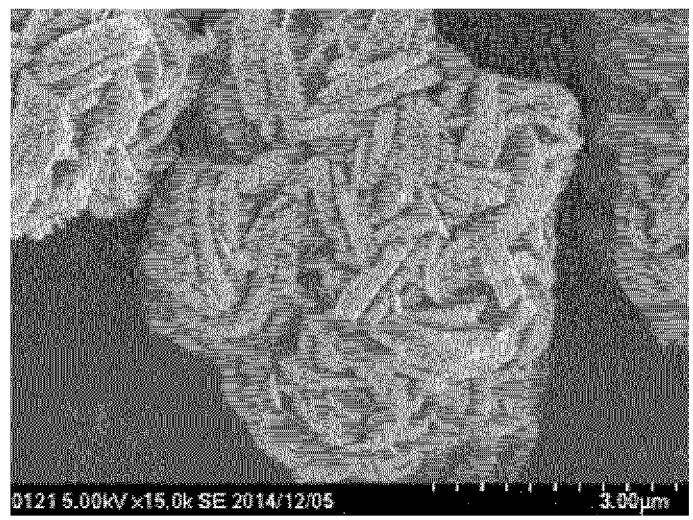
FIG. 3 is a SEM photograph (observation magnification of ×15,000) of a nickel cobalt complex hydroxide of Example 1.

In a case where the pre-reaction solution contains the complex ion forming agent in the step of forming seed crystals, a secondary particles of a nickel cobalt complex hydroxide obtained after the step of second crystallization consists of a rod-like or plate-like primary particles having an average particle diameter of from 0.3 to 3 μm as exemplified in FIG. 3. In addition, the inside of the secondary particles is dense as exemplified in FIG. 4. Furthermore, a lithium transition metal oxide for which the nickel cobalt complex hydroxide is used as a raw material has a solid structure as exemplified in FIG. 7.

In a case where a lithium transition metal oxide is obtained by use of the nickel cobalt complex hydroxide as a raw material, composition ratio (Ni:Mn:Co:M) of this complex hydroxide is approximately coincident with composition ratio of the obtained lithium transition metal oxide.

Method for Producing Positive Electrode Active Material for Non-Aqueous Electrolyte Secondary Battery Moisture contained in the nickel cobalt complex hydroxide can be removed and a nickel cobalt transition metal oxide can be obtained by a heat treatment of the nickel cobalt complex hydroxide under an air atmosphere (see the heat treating in the flowchart of FIG. 1 or FIG. 2). The heat treatment is preferably carried out at a temperature of from 105 to 900° C., further preferably from 250° C. to 650° C. Time for the heat treatment is preferably from 5 to 30 hours, further preferably from 10 to 20 hours.

In the step of mixing in the flowchart of FIG. 1 or 2, the nickel cobalt transition metal oxide and a lithium compound are mixed to obtain a mixture containing lithium.

A known mixing method can be used as appropriate. For example, dry-mixing the starting raw material using an agitation mixing machine or the like, or preparing a slurry of starting raw materials and wet-mixing using a mixer such as ball mill or the like. For the lithium compound, for example, lithium hydroxide, lithium nitrate, lithium carbonate, or a mixture of those can be used.

A ratio of the total of molar amounts of metals other than lithium to the molar amount of lithium in the lithium mixture is preferably in a range of 0.95 to 1.20. In the case of the ratio less than 0.95, formation of by-product is observed. In the case of the ratio exceeding 1.3, alkaline component is increased on the surface, and moisture adsorption due to deliquescent property of the alkaline component is observed, resulting in poor handling ability.

A calcination step shown in FIG. 1 or 2 is a step for calcining the lithium mixture obtained in the mixing step to obtain a lithium transition metal complex oxide. The lithium transition metal complex oxide can be obtained by diffusion of lithium in the lithium compound into the nickel cobalt transition metal oxide in the calcination step.

Calcination is preferably carried out at a temperature from 700 to 1100° C. The calcination temperature is further preferably from 750 to 1000° C. In the case of the calcination temperature of less than 700° C., diffusion of lithium is insufficient. In the case of the calcination temperature exceeding 1100° C., diffusion of the element M occurs, and the distribution of the element M inside the secondary particles is homogeneous. Calcination time of 10 hours or more is sufficient as a time to maintain a maximum temperature.

Calcination is preferably carried out in an oxidizing atmosphere, more preferably an atmosphere containing from 10 to 100% by volume of oxygen.

After the calcination, a treatment such as cracking, pulverizing and dry-sieving of the lithium transition metal oxide is carried out as necessary to obtain a positive electrode active material according to the present disclosure.

Positive Electrode Active Material for Non-Aqueous Electrolyte Secondary Battery A positive electrode active material according to the present disclosure comprises a lithium transition metal complex oxide represented by a formula: $Li_aNi_{1-x-y}Co_xM_{n_y}M_zO_2$, wherein $0.955 \leq a \leq 1.2$, $0.10 \leq x \leq 0.35$, $0 \leq y \leq 0.35$, $0 < z \leq 0.05$, M is at least one element selected from a group consisting of Al, Mg, Ca, Ti, Zr, Nb, Ta, Cr, Mo, W, Fe, Cu, Si, Sn, Bi, Ga, Y, Sm, Er, Ce, Nd, La, Cd, Lu. The lithium transition metal complex oxide has hexagonal crystal structure having a layered structure.

The range of "a" for lithium is from 0.95 to 1.2 in the lithium transition metal oxide according to the present disclosure. In a case where "a" is less than 0.95, an interfacial resistance is increased which generates at an interface between a surface of a positive electrode and an electrolyte in a non-aqueous electrolyte secondary battery for which the positive electrode active material comprising the obtained lithium transition metal oxide is used, and thus, output power of the battery is decreased. On the other hand, in a case where "a" exceeds 1.2, initial discharge capacity is reduced when the positive electrode active material is used in the positive electrode of the battery.

The values of "x" and "y" are determined with taking into consideration the charge and discharge capacity, cycle characteristics, safety and the like of a non-aqueous electrolyte secondary battery for which the positive electrode active material comprising the obtained lithium transition metal oxide is used. The value of "x" is in a range of 0.10 to 0.35, the value of "y" is in a range of 0 to 0.35, preferably in a range of 0.10 to 0.35, and the value of "z" is in a range of 0.05 or less, preferably in a range of 0.02 or less.

In a case where the range of "z" for the element M exceeds 0.05, the charge and discharge capacities are reduced due to the decreased amount of metal element contributing a reduction reaction.

The lithium transition metal complex oxide is in a form of secondary particles formed by aggregation of primary particles. The secondary particles are made of a first layer having a radial depth ratio of less than 5% from the surface in the secondary particles, a second layer having a radial depth ratio in a range of 5% to less than 50% and located at an inner side than the first layer in the secondary particles, and a third layer having a radial depth ratio of 50% or more and located at an inner side than the second layer in the secondary particles. A SEM-EDX spectrum of the element M in the depth direction in the secondary particles has a peak in the second layer. An accelerating voltage when measuring the SEM-EDX is set to 10 kV.

The lithium transition metal complex oxide is dispersed in an epoxy resin and solidified. Then, a cross-section of the secondary particles is formed by using a cross-section polisher. Distribution of the element M inside the secondary particles can be determined by using the line analysis of this cross-section with EDX.

When a CPS curve of the element M is determined by the line analysis, a specific peak as described below usually appears. In the present specification, "CPS curve of a complex oxide" is a plot of a depth ratio in the radial direction to a radius of the secondary particles of the lithium transition metal complex oxide on the horizontal axis and fluorescent X-ray intensity along the radius on the vertical axis, and usually represented as a graph connecting the plotted points. The fluorescent X-ray intensity is represented by relative difference from the intensity at a starting point for measuring the secondary particles assuming that intensity at a starting point for measuring the particles is zero.

The peak means a peak comprising a point of maximum coordinate value of the vertical axis among peaks comprised in the CPS curve of the complex oxide.

Assuming that the amount of the element M in the first layer of the lithium transition metal complex oxide is S4, that the amount of the element M in the second layer is S5, and that the amount of the element M in the third layer is S6, the amounts of S4, S5 and S6 can be evaluated as described below.

The CPS curve of the complex oxide shown in FIG. 5 and the like looks like a single curve. Actually, however, there are a number of plots. In the CPS curve of the complex oxide, the product of a distance between each plot and a coordinate value of the vertical axis is determined as an area between each plot. An average value of an area between each plot corresponding to the first layer is defined as S4, an average value of an area between each plot corresponding to the second layer is defined as S5 and an average value of an area between each plot corresponding to the third layer is defined as S6.

The relation between the S4 and the S5 preferably satisfies an inequality of S5>1.02 S4. In the case of S5<1.02 S4, a distribution of the element M in the first layer and the second layer of the complex oxide particles is homogeneous or the element M is more distributed in the first layer.

The relation between the S5 and the S6 preferably satisfies an inequality of S5>1.02 S6. In the case of S5<1.02 S6, the distribution of the element M in the second layer and the third layer of the complex oxide particles is homogeneous, or the element M is more distributed in the third layer.

Since the element M is homogeneously dispersed inside the primary particles of the nickel cobalt complex hydroxide, the element M is also homogeneously dispersed inside the primary particles in the positive electrode active material for which the nickel cobalt manganese complex hydroxide particles is used. On the other hand, in a case where the nickel cobalt complex hydroxide and the element M are dry-mixed or in a case where the primary particles is covered with the element M, the element M is not dispersed homogeneously inside the primary particles, but the element M is segregated outside the primary particles.

The secondary particles of the lithium transition metal complex oxide preferably has an average particle diameter in a range of 1 to 20 μm. A structure inside the secondary particles may be a hollow structure comprising a hollow part in the third layer, or it may also be a solid structure as exemplified in FIG. 7.

Hereinafter, more specific examples will be described in Examples.

Example 1

Production of Nickel Cobalt Complex Hydroxide

A nickel cobalt complex hydroxide is prepared in a manner shown below.

Forming Seed Crystals

First, the pre-reaction solution is prepared by putting water of up to 10 kg into a reaction vessel, and adding aqueous ammonia with stirring to adjust ammonium ion concentration to be 1.8% by mass. The temperature within the vessel is set to 25° C., and nitrogen gas is circulated in the reaction vessel to maintain oxygen concentration in a space inside the reaction vessel to 10% or less. 25% by mass of sodium hydroxide solution is added to the water in the reaction vessel to adjust pH value of the solution in the vessel to a range of 9.5 to 12.0.

Next, a nickel sulfate solution, a cobalt sulfate solution, and a manganese sulfate solution are mixed to obtain a mixed solution, in which a molar ratio of the metal elements is 1:1:1.

While controlling pH value in the reaction solution to a range of 9.5 to 12.0 with a sodium hydroxide solution, the mixed solution is added to the reaction vessel so that the reaction solution contains a solute of 4 mol.

First Crystallization

The temperature within the vessel is maintained to 25° C. or more until the step of forming seed crystals is completed. The mixed solution in an amount corresponding to the solute of 770 mol and aqueous ammonia are added simultaneously to the reaction vessel such that ammonium ion concentration in the solution is 2000 ppm or more to carry out the step of first crystallization while supplying a sodium hydroxide solution to control pH value in the reaction solution to a range of from 9.5 to 12.0.

Second Crystallization

After the step of first crystallization, the temperature within the vessel is maintained to 25° C. or more until the step of second crystallization is completed. The mixed solution in an amount corresponding to the solute of 430 mol, an ammonium tungstate solution containing tungsten equivalent to 12 mol and aqueous ammonia are added simultaneously to the reaction vessel such that ammonium ion concentration in the solution is 2000 ppm or more to carry out the step of second crystallization while supplying a sodium hydroxide solution to control pH value in the reaction solution to a range of 9.5 to 12.0. Then, the product can be washed with water, filtrated and dried to obtain a complex hydroxide.

Analysis of Nickel Cobalt Complex Hydroxide

It is possible to confirm that a composition of the nickel cobalt complex hydroxide is $Ni_{0.33}Co_{0.33}Mn_{0.33}W_{0.01}(OH)_{2+a}$, wherein $0 \leq a \leq 0.5$ by dissolving its sample with an inorganic acid and then carrying out a chemical analysis by ICP emission spectrometry.

From a SEM observation (magnification of ×15,000) of the nickel cobalt complex hydroxide, rod-like or plate-like primary particles having an average particle diameter in a range of 0.5 to 1.5 μm can be confirmed as exemplified in FIG. 3. Also, it is possible to confirm that the secondary particles has an average particle diameter of 5 μm.

The nickel cobalt complex hydroxide is dispersed in an epoxy resin and solidified. Then, a cross-section of the secondary particles is formed by using a cross-section polisher (manufactured by JEOL Ltd., Japan).

Figure 4:
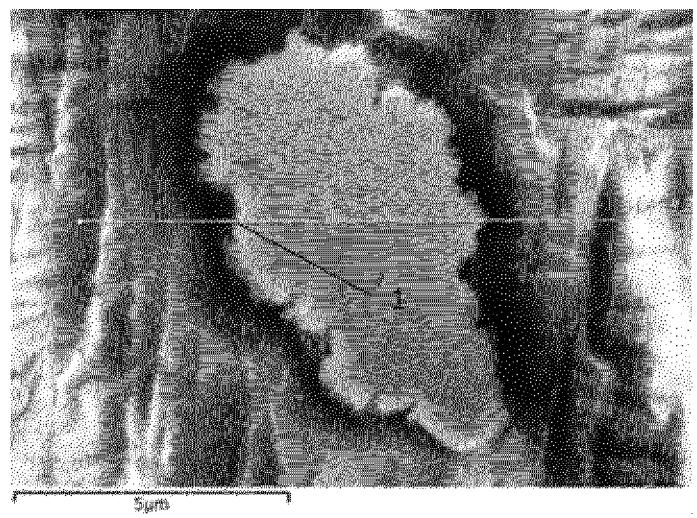
FIG. 4 is a cross-sectional SEM photograph of the nickel cobalt complex hydroxide of Example 1.

It is possible to confirm that the inside of the secondary particles is dense as exemplified in FIG. 4 by SEM observation of the cross-section.

It is possible to confirm a peak in the second layer from the obtained CPS curve as exemplified in FIG. 5 by the line analysis of the cross-section with an energy dispersive X-ray analyzer EDX.

It is possible to confirm that S1 and S2 satisfy an inequality of S2>1.02 S1 from the CPS curve since S2 is 1.83 and S1 is 0.76.

It is possible to confirm that S2 and S3 satisfy an inequality of S2>1.02 S3 from the CPS curve since S3 is 0.

Production of Positive Electrode Active Material

The nickel cobalt complex hydroxide is heat-treated at 300° C. for 20 hours under an air (oxygen: 21% by volume) atmosphere, and is retrieved as a nickel cobalt transition metal complex oxide. Next, the nickel cobalt transition metal complex oxide is mixed with lithium carbonate such that a molar ratio of lithium carbonate to the nickel cobalt transition metal complex oxide is 1.15-fold, and the mixture is calcined at 960° C. for 15 hours in an air atmosphere. After calcination, a dispersion treatment is carried out, so that a positive electrode active material comprising lithium transition metal complex oxide can be obtained.

Analysis of Lithium Transition Metal Complex Oxide

It is possible to confirm that a composition of the lithium transition metal complex oxide is $Li_{1.15}Ni_{0.33}Co_{0.33}Mn_{0.33}W_{0.01}O_2$ by dissolving its sample with an inorganic acid and then carrying out a chemical analysis by ICP emission spectrometry.

Figure 6:
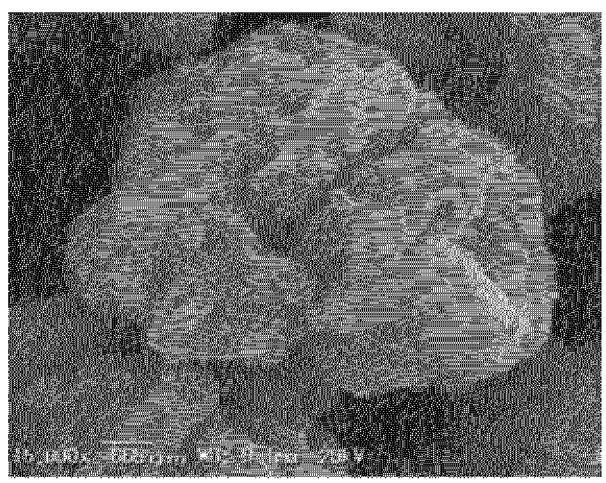
FIG. 6 is a SEM photograph (observation magnification of ×15,000) of a lithium transition metal complex oxide of Example 1.

It is possible to confirm that a plurality of rod-like or plate-like primary particles having an average particle diameter of from 0.3 to 2.0 μm aggregates into a secondary particles having an average particle diameter of 5 μm as exemplified in FIG. 6 by SEM observation (magnification of ×15000) of the lithium transition metal complex oxide.

The lithium transition metal complex oxide is dispersed in an epoxy resin and solidified, and then, a cross-section of the secondary particles is formed by the cross-section polisher (manufactured by JEOL Ltd., Japan).

Figure 7:
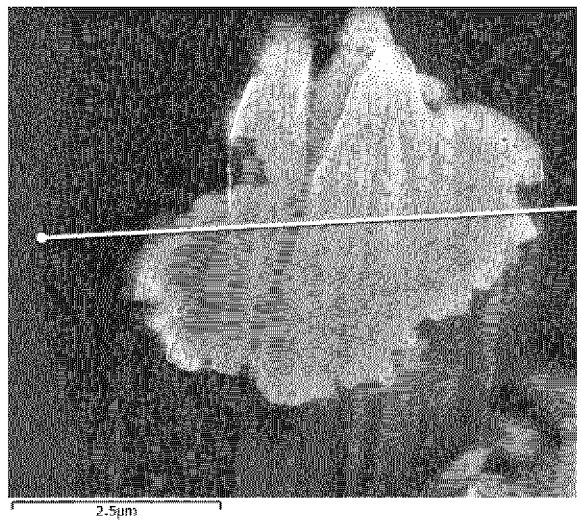
FIG. 7 is a cross-sectional SEM photograph of the lithium transition metal complex oxide of Example 1.

It is possible to confirm that the secondary particles has a solid structure as exemplified in FIG. 7 by SEM observation of the cross-section.

Figure 8:
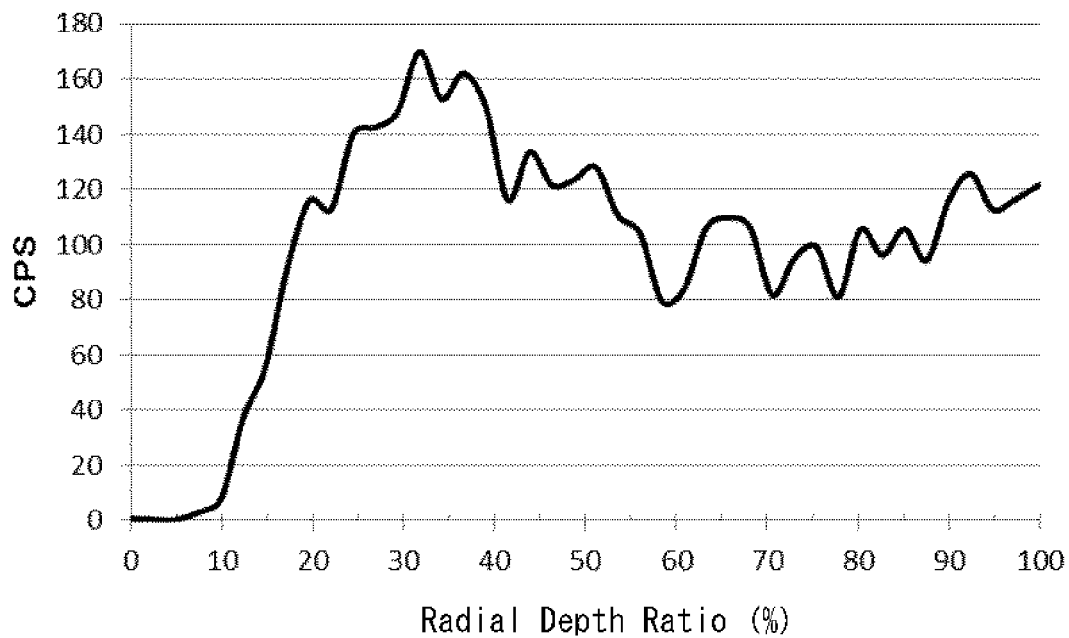
FIG. 8 is a CPS curve of the lithium transition metal complex oxide of Example 1.

It is possible to confirm a peak at the second layer from the obtained CPS curve of the complex oxide as exemplified in FIG. 8 by the line analysis of the cross-section with the energy dispersive X-ray analyzer EDX.

It is possible to confirm that S4 and S5 satisfy an inequality of S5>1.02 S4 from the CPS curve of the complex oxide since S5 is 0.657 and S4 is 0.0018.

It is possible to confirm that S2 and S3 satisfy an inequality of S2>1.02 S3 from the CPS curve of the complex oxide since S6 is 0.60.

Comparative Example 1

Production of Nickel Cobalt Complex Hydroxide

Forming Seed Crystals

The step of forming seed crystals is carried out under a condition similar to that in Example 1.

First Crystallization

The step of first crystallization is not carried out.

Second Crystallization

After the step of forming seed crystals, a temperature within the vessel is maintained to 25° C. or more until the step of second crystallization is completed. The mixed solution in an amount corresponding to the solute of 1200 mol, an ammonium tungstate solution containing tungsten equivalent to 12 mol and aqueous ammonia are added simultaneously to the reaction vessel such that ammonium ion concentration in the solution is 2000 ppm or more to carry out the step of second crystallization while supplying a sodium hydroxide solution to control pH value in the reaction solution to a range of from 9.5 to 12.0. Then, the product can be washed with water, filtrated and dried to obtain a complex hydroxide.

Analysis of Complex Hydroxide

It is possible to confirm that a composition of the complex hydroxide is $Ni_{0.33}Co_{0.33}Mn_{0.33}W_{0.01}(OH)_{2+a}$, wherein $0 \le a \le 0.5$ by the chemical analysis in a similar manner to that in Example 1.

A cross-section of the secondary particles of the complex hydroxide is exposed in a similar manner to that in Example 1.

Figure 9:
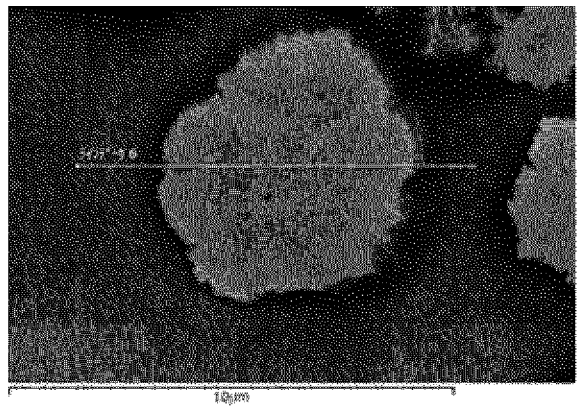
FIG. 9 is a cross-sectional SEM photograph of a nickel cobalt complex hydroxide of Comparative Example 1.

It is possible to confirm that the inside of the secondary particles is dense as exemplified in FIG. 9 by SEM observation of the cross-section.

Figure 10:
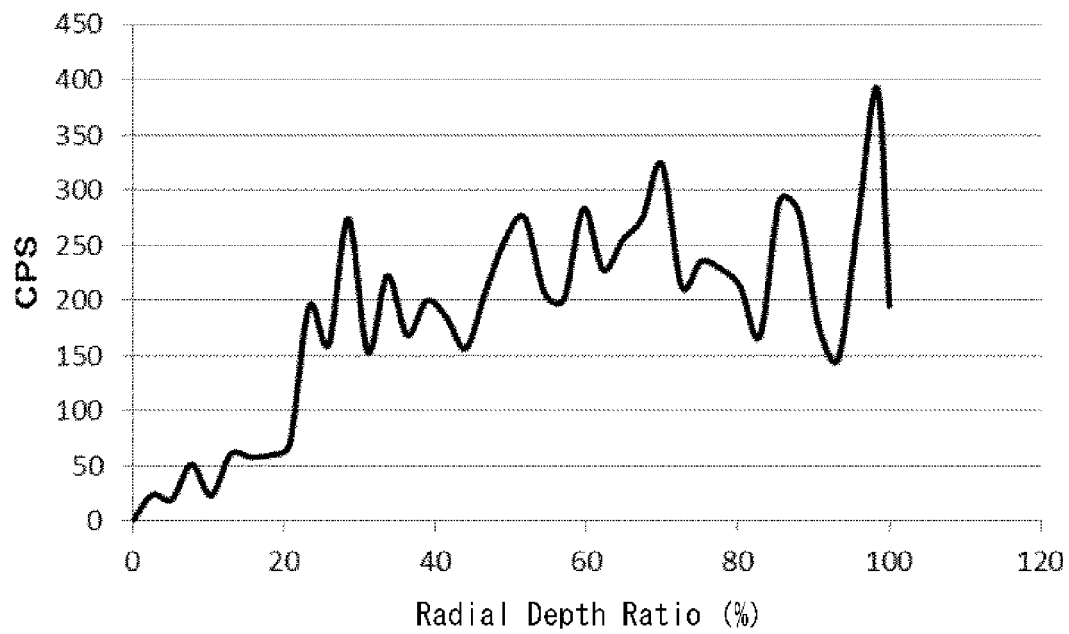
FIG. 10 is a CPS curve of the nickel cobalt complex hydroxide of Comparative Example 1.

It is possible to confirm a peak at the third layer from the obtained CPS curve as exemplified in FIG. 10 by the line analysis with EDX in a similar manner to that in Example 1.

It is possible to confirm that S1 and S2 satisfy an inequality of S2>1.02 S1 from the CPS curve since S2 is 11.12 and S1 is 1.04.

It is possible to confirm that S2 and S3 satisfy an inequality of S2<S3 from the CPS curve since S3 is 17.4.

Production of Positive Electrode Active Material

The step of forming seed crystals is carried out under a condition similar to that in Example 1.

Analysis of Lithium Transition Metal Complex Oxide

It is possible to confirm that a composition of the lithium transition metal complex oxide is $Li_{1.15}Ni_{0.33}Co_{0.33}Mn_{0.33}W_{0.01}O_2$ by the chemical analysis in a similar manner to that in Example 1.

A cross-section of the secondary particles of the lithium transition metal complex oxide is exposed under a condition similar to that in Example 1.

Figure 11:
FIG. 11 is a cross-sectional SEM photograph of a lithium transition metal complex oxide of Comparative Example 1.

It is possible to confirm that the secondary particles has a solid structure as exemplified in FIG. 11 by SEM observation of the cross-section.

Figure 12:
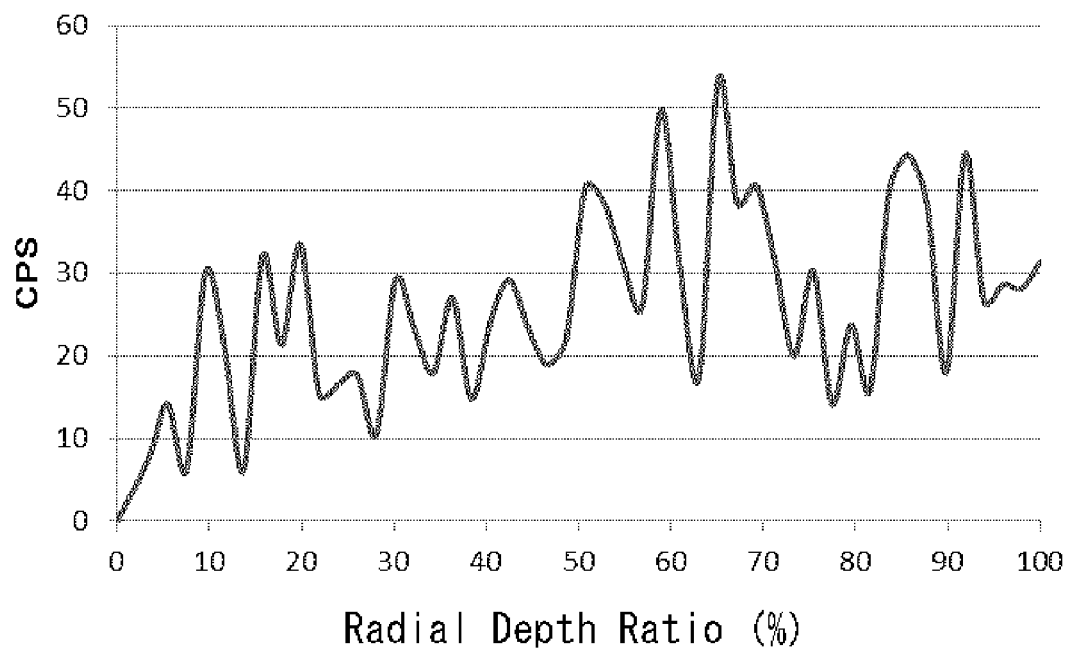
FIG. 12 is a CPS curve of the lithium transition metal complex oxide of Comparative Example 1.

A line analysis using EDX is performed in a similar manner as in Example 1, and It is confirmed that a peak at the third layer from the obtained CPS curve as exemplified in FIG. 12 by the line analysis with EDX in a similar manner to that in Example 1.

It is possible to confirm that S4 and S5 satisfy an inequality of S5>1.02 S4 from the CPS curve of the complex oxide since S5 is 1.34 and S4 is 0.45.

It is possible to confirm that S5 and S6 satisfy an inequality of S5<S6 from the CPS curve since S6 is 1.95.

Comparative Example 2

Production of Nickel Cobalt Complex Hydroxide

A complex hydroxide is prepared in a manner shown below.

Forming Seed Crystals

The step of forming seed crystals is carried out under a condition similar to that in Example 1.

First Crystallization

After the step of forming seed crystals, a temperature within the vessel is maintained to 25° C. or more until the step of second crystallization is completed. The mixed solution in an amount corresponding to the solute of 200 mol and aqueous ammonia are added simultaneously to the reaction vessel such that the ammonium ion concentration in the solution is 2000 ppm or more to carry out the step of first crystallization while supplying a sodium hydroxide solution to control pH value in the reaction solution to a range of from 9.5 to 12.0.

Second Crystallization

After the step of first crystallization, the temperature within the vessel is maintained to 25° C. or more. The mixed solution in an amount corresponding to the solute of 1000 mol, an ammonium tungstate solution containing tungsten equivalent to 12 mol and aqueous ammonia are added simultaneously to the reaction vessel such that the ammonium ion concentration in the solution is 2000 ppm or more to carry out the step of second crystallization while supplying a sodium hydroxide solution to control pH value in the reaction solution to a range of 9.5 to 12.0. Then, the product can be washed with water, filtrated and dried to obtain a complex hydroxide.

Analysis of Nickel Cobalt Complex Hydroxide

It is possible to confirm that a composition of the complex hydroxide is $Ni_{0.33}Co_{0.33}Mn_{0.33}W_{0.01}(OH)_{2+a}$, wherein $0 \le a \le 0.5$ by the chemical analysis in a similar manner to that in Example 1.

A cross-section of the secondary particles of the nickel cobalt complex hydroxide is exposed in a similar condition to that in Example 1.

Figure 13:
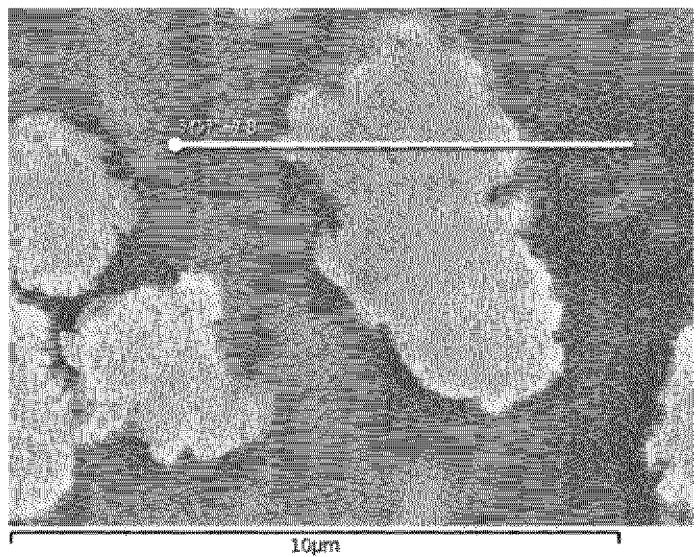
FIG. 13 is a cross-sectional SEM photograph of a nickel cobalt complex hydroxide of Comparative Example 2.

It is possible to confirm that the inside of the secondary particles is dense as exemplified in FIG. 13 by SEM observation of the cross-section.

Figure 14:
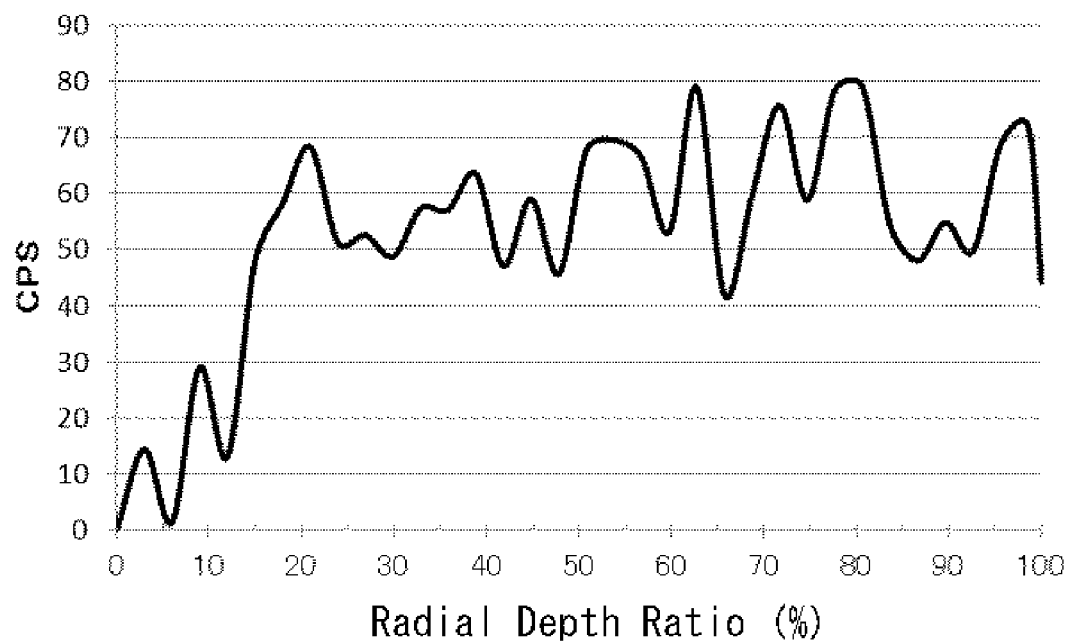
FIG. 14 is a CPS curve of the nickel cobalt complex hydroxide of Comparative Example 2.

It is possible to confirm a peak at the third layer from the obtained CPS curve as exemplified in FIG. 14 by the line analysis with EDX in a similar manner to that in Example 1.

It is possible to confirm that S1 and S2 satisfy an inequality of S2>1.02 S1 from the CPS curve since S2 is 3.09 and S1 is 0.32.

It is possible to confirm that S2 and S3 satisfy an inequality of S2<S3 from the CPS curve since S3 is 3.74.

Production of Positive Electrode Active Material

Preparation is carried out under a condition similar to that in Example 1.

Analysis of Lithium Transition Metal Complex Oxide

It is possible to confirm that a composition of the lithium transition metal complex oxide is $Li_{1.15}Ni_{0.33}Co_{0.33}Mn_{0.33}W_{0.01}O_2$ by the chemical analysis in a similar manner to that in Example 1.

A cross-section of the secondary particles of the lithium transition metal complex oxide is exposed under a condition similar to that in Example 1.

Figure 15:
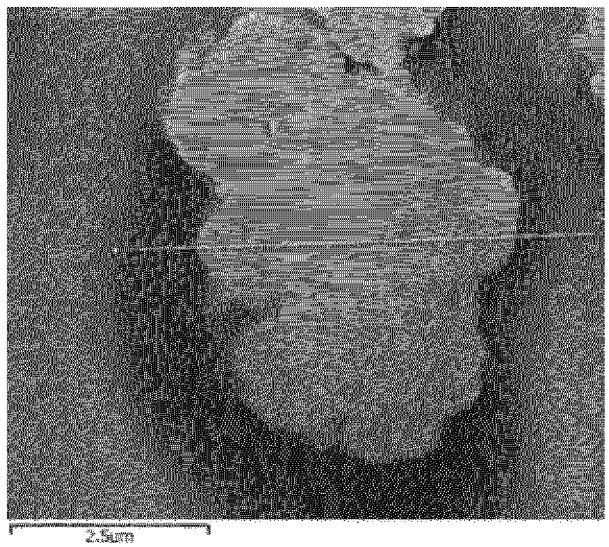
FIG. 15 is a cross-sectional SEM photograph of a lithium transition metal complex oxide of Comparative Example 2.

It is possible to confirm the secondary particles has a solid structure as exemplified in FIG. 15 by SEM observation of the cross-section.

Figure 16:
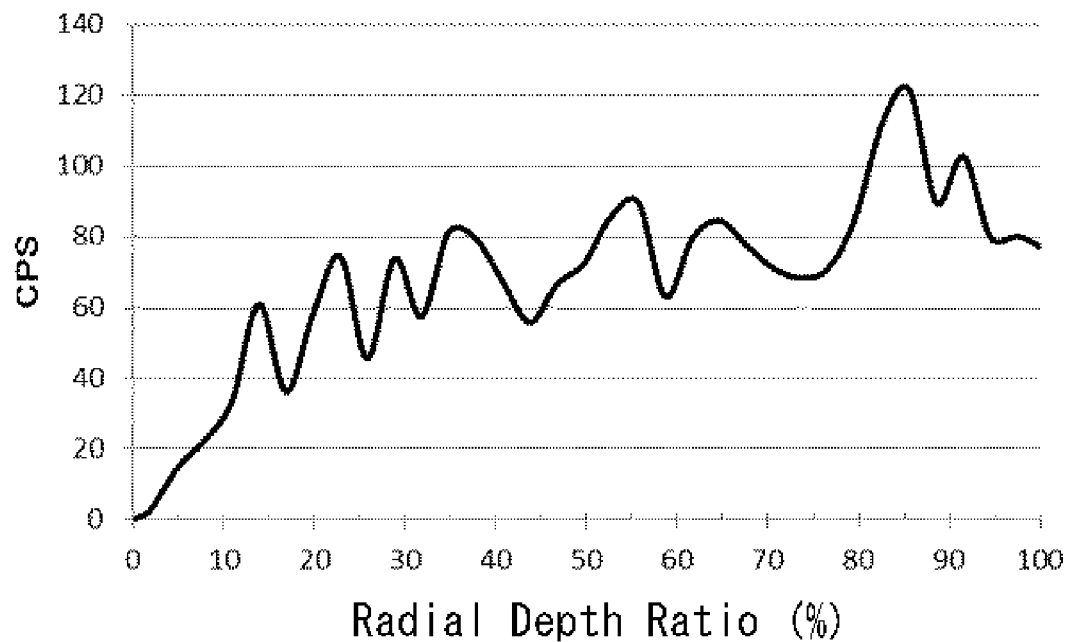
FIG. 16 is a CPS curve of the lithium transition metal complex oxide of Comparative Example 2.

It is possible to confirm a peak at the third layer from the obtained CPS curve as exemplified in FIG. 16 by the line analysis with EDX in a similar manner to that in Example 1.

It is possible to confirm that S4 and S5 satisfy an inequality of S5>1.02 S4 from the CPS curve of the complex oxide since S5 is 3.58 and S4 is 0.35.

It is possible to confirm that S5 and S6 satisfy an inequality of S5<S6 from the CPS curve since S6 is 5.14.

Example 2

Production of Nickel Cobalt Complex Hydroxide

A complex hydroxide is prepared in a manner shown below.

Forming Seed Crystals

The step of forming seed crystals is carried out under a condition similar to that in Example 1.

First Crystallization

A temperature within the vessel is maintained to 25° C. or more until the step of forming seed crystals is completed. The mixed solution in an amount corresponding to the solute of 600 mol and aqueous ammonia are added simultaneously to the reaction vessel such that the ammonium ion concentration in the solution is 2000 ppm or more to carry out the step of first crystallization while supplying a sodium hydroxide solution to control pH value in the reaction solution to a range of 9.5 to 12.0.

Second Crystallization

After the step of first crystallization, the temperature within the vessel is maintained to 25° C. or more until the step of second crystallization is completed. The mixed solution in an amount corresponding to the solute of 600 mol, an ammonium tungstate solution containing tungsten equivalent to 12 mol and aqueous ammonia are added simultaneously to the reaction vessel such that the ammonium ion concentration in the solution is 2000 ppm or more to carry out the step of second crystallization while supplying a sodium hydroxide solution to control pH value in the reaction solution to a range of 9.5 to 12.0. Then, the product can be washed with water, filtrated and dried to obtain a complex hydroxide.

Analysis of Nickel Cobalt Complex Hydroxide

It is possible to confirm that a composition of the complex hydroxide is $Ni_{0.33}Co_{0.33}Mn_{0.33}W_{0.01}(OH)_{2+a}$, wherein $0 \leq a \leq 0.5$ by the chemical analysis in a similar manner to that in Example 1.

A cross-section of the secondary particles of the nickel cobalt complex hydroxide is exposed in a similar condition to that in Example 1.

Figure 17:
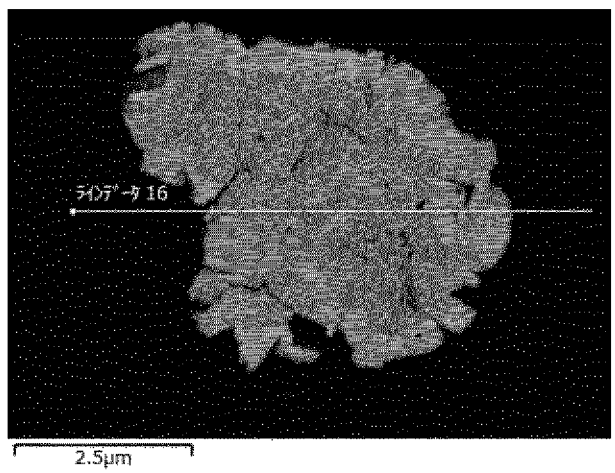
FIG. 17 is a cross-sectional SEM photograph of a nickel cobalt complex hydroxide of Example 2.

It is possible to confirm that the inside of the secondary particles is dense as exemplified in FIG. 17 by SEM observation of the cross-section.

Figure 18:
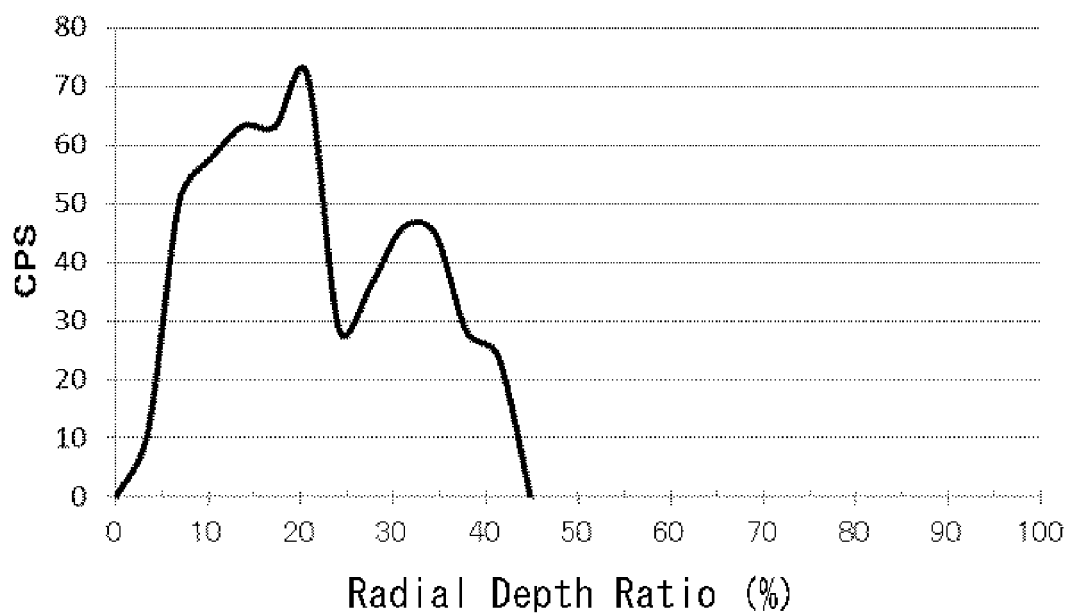
FIG. 18 is a CPS curve of the nickel cobalt complex hydroxide of Example 2.

It is possible to confirm a peak at the second layer from the obtained CPS curve as exemplified in FIG. 18 by the line analysis with EDX in a similar manner to that in Example 1.

It is possible to confirm that S1 and S2 satisfy an inequality of S2>1.02 S1 from the CPS curve since S2 is 2.78 and S1 is 1.50.

It is possible to confirm that S2 and S3 satisfy an inequality of S2>1.02 S3 from the CPS curve since S3 is 0.

Production of Positive Electrode Active Material

Preparation is carried out under a condition similar to that in Example 1.

Analysis of Lithium Transition Metal Complex Oxide

It is possible to confirm that a composition of the lithium transition metal complex oxide is $Li_{1.15}Ni_{0.33}Co_{0.33}Mn_{0.33}W_{0.01}O_2$ by the chemical analysis in a similar manner to that in Example 1.

A cross-section of the secondary particles of the lithium transition metal complex oxide is exposed under a condition similar to that in Example 1.

Figure 19:
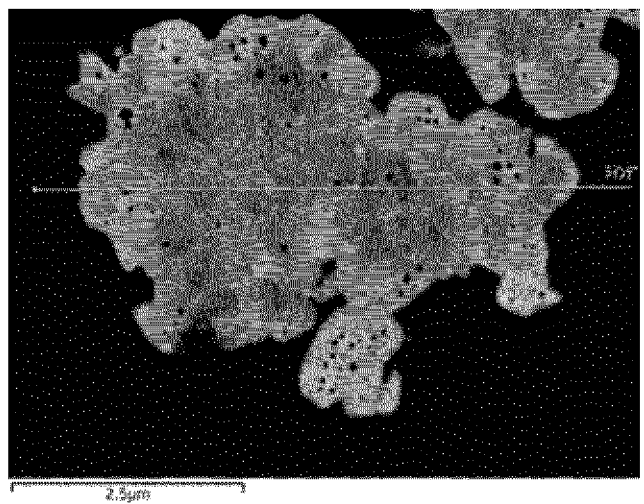
FIG. 19 is a cross-sectional SEM photograph of a lithium transition metal complex oxide of Example 2.

It is possible to confirm the secondary particles has a solid structure as exemplified in FIG. 19 by SEM observation of the cross-section.

Figure 20:
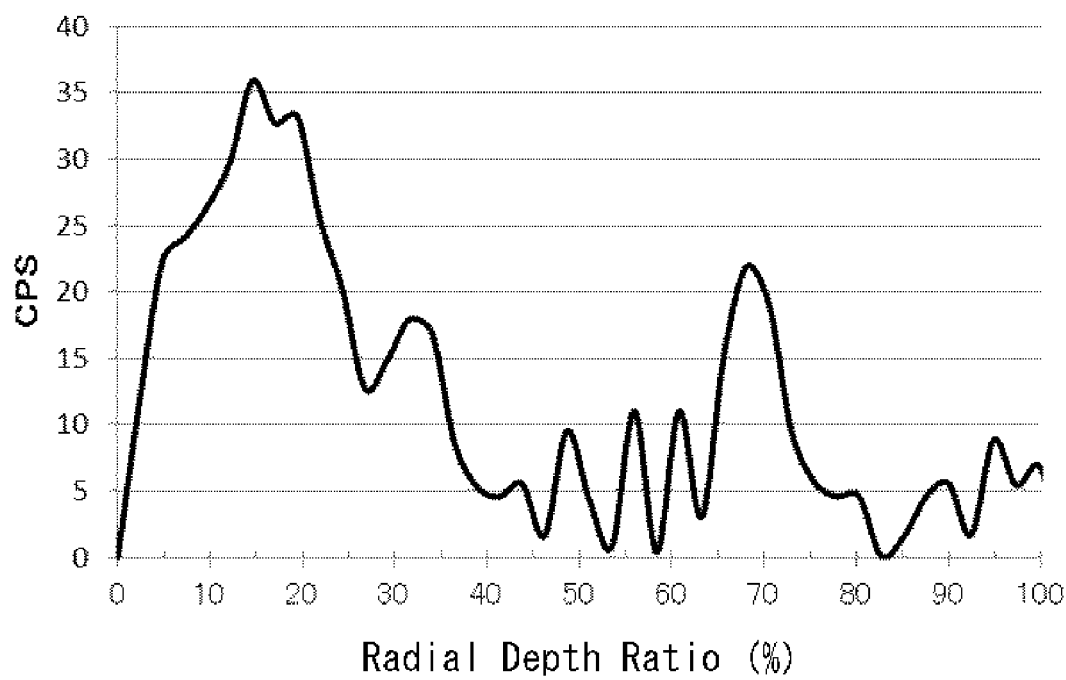
FIG. 20 is a CPS curve of the lithium transition metal complex oxide of Example 2.

It is possible to confirm a peak at the second layer from the obtained CPS curve as exemplified in FIG. 20 by the line analysis with EDX in a similar manner to that in Example 1.

It is possible to confirm that S4 and S5 satisfy an inequality of S5>1.02 S4 from the CPS curve of the complex oxide since S5 is 2.24 and S4 is 1.49.

It is possible to confirm that S5 and S6 satisfy an inequality of S5>1.02 S6 from the CPS curve of the complex oxide since S6 is 0.75.

Example 3

Production of Nickel Cobalt Complex Hydroxide

A complex hydroxide is prepared in a manner shown below.

Forming Seed Crystals

The step of forming seed crystals is carried out under a condition similar to that in Example 1.

First Crystallization

A temperature within the vessel is maintained to 25° C. or more until the step of forming seed crystals is completed. The mixed solution in an amount corresponding to the solute of 1104 mol and aqueous ammonia are added simultaneously to the reaction vessel such that the ammonium ion concentration in the solution is 2000 ppm or more to carry out the step of first crystallization while supplying a sodium hydroxide solution to control pH value in the reaction solution to a range of 9.5 to 12.0.

Second Crystallization

After the step of first crystallization, the temperature within the vessel is maintained to 25° C. or more until the step of second crystallization is completed. The mixed solution in an amount corresponding to the solute of 96 mol, an ammonium tungstate solution containing tungsten equivalent to 6 mol and aqueous ammonia are added simultaneously to the reaction vessel such that the ammonium ion concentration in the solution is 2000 ppm or more to carry out the step of second crystallization while supplying a sodium hydroxide solution to control pH value in the reaction solution to a range of from 9.5 to 12.0. Then, the product can be washed with water, filtrated and dried to obtain a complex hydroxide.

Analysis of Nickel Cobalt Complex Hydroxide

It is possible to confirm that a composition of the complex hydroxide is $Ni_{0.33}Co_{0.33}Mn_{0.33}W_{0.005}(OH)_{2+a}$, wherein $0 \leq a \leq 0.5$ by the chemical analysis in a similar manner to that in Example 1.

A cross-section of the secondary particles of the nickel cobalt complex hydroxide is exposed in a similar condition to that in Example 1.

Figure 21:
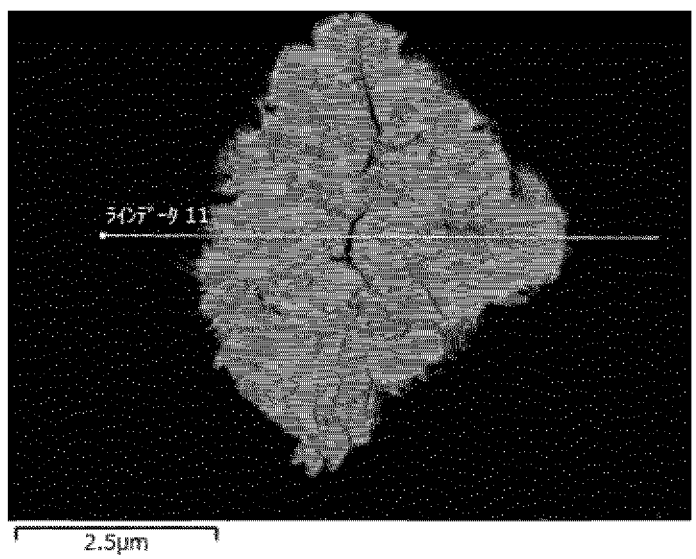
FIG. 21 is a cross-sectional SEM photograph of a nickel cobalt complex hydroxide of Example 3.

It is possible to confirm that the inside of the secondary particles is dense as exemplified in FIG. 21 by SEM observation of the cross-section.

Figure 22:
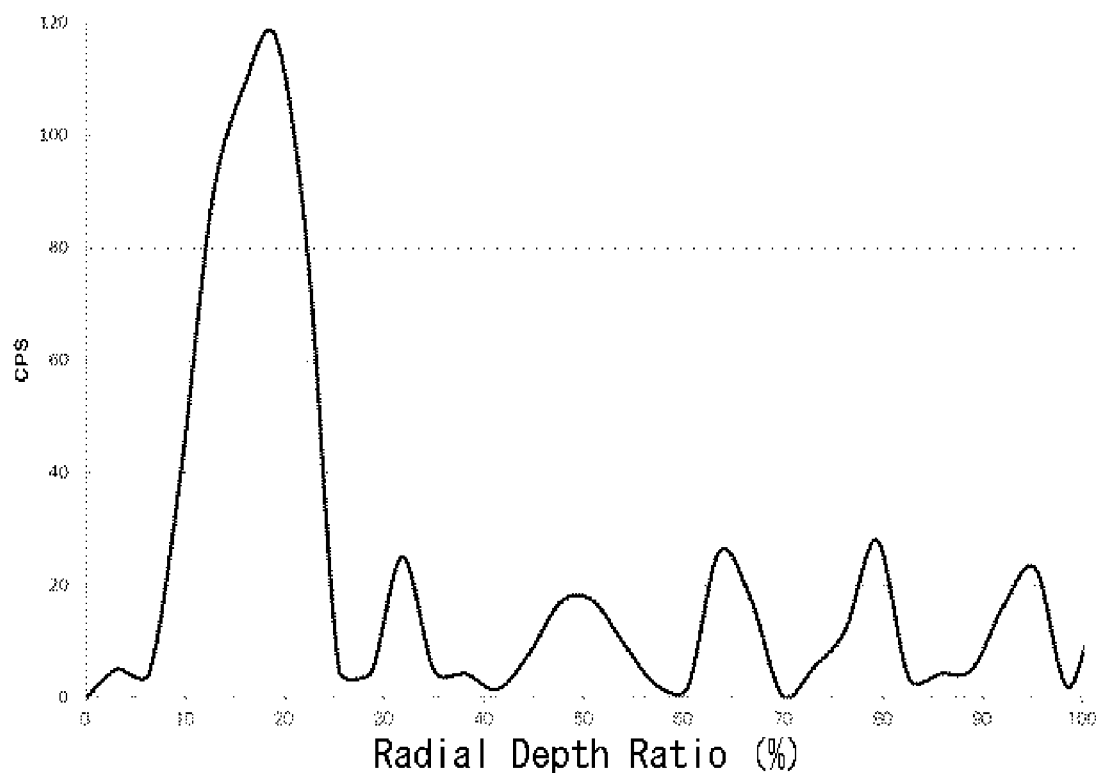
FIG. 22 is a CPS curve of the nickel cobalt complex hydroxide of Example 3.

It is possible to confirm a peak at the second layer from the obtained CPS curve as exemplified in FIG. 22 by the line analysis with EDX in a similar manner to that in Example 1.

It is possible to confirm that S1 and S2 satisfy an inequality of S2>1.02 S1 from the CPS curve since S2 is 5.39 and S1 is 0.43.

It is possible to confirm that S2 and S3 satisfy an inequality of S2>1.02 S3 from the CPS curve since S3 is 1.49.

Production of Positive Electrode Active Material

Preparation is carried out under a condition similar to that in Example 1.

Analysis of Lithium Transition Metal Complex Oxide

It is possible to confirm that a composition of the lithium transition metal complex oxide is $Li_{1.15}Ni_{0.33}Co_{0.33}Mn_{0.33}W_{0.005}O_2$ by the chemical analysis in a similar manner to that in Example 1.

A cross-section of the secondary particles of the lithium transition metal complex oxide is exposed under a condition similar to that in Example 1.

Figure 23:
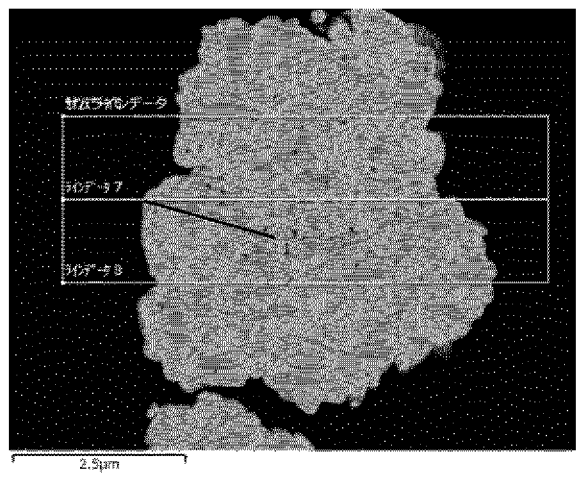
FIG. 23 is a cross-sectional SEM photograph of a lithium transition metal complex oxide of Example 3.

It is possible to confirm the secondary particles has a solid structure as exemplified in FIG. 23 by SEM observation of the cross-section.

Figure 24:
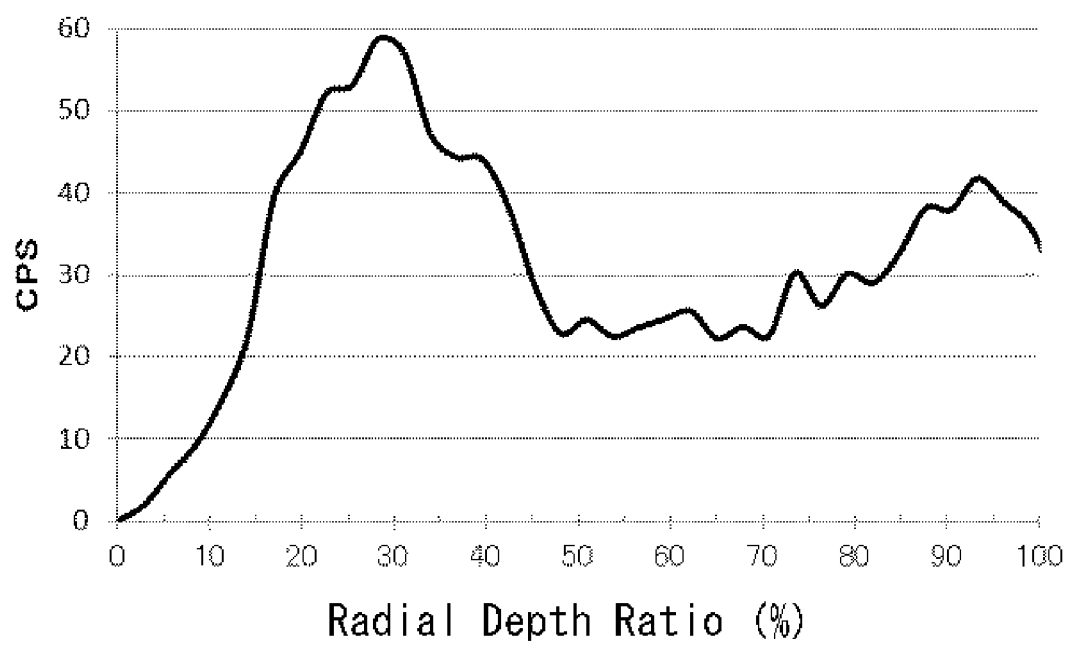
FIG. 24 is a CPS curve of the lithium transition metal complex oxide of Example 3.

It is possible to confirm a peak at the second layer from the obtained CPS curve as exemplified in FIG. 24 by the line analysis with EDX in a similar manner to that in Example 1.

It is possible to confirm that S4 and S5 satisfy an inequality of S5>1.02 S4 from the CPS curve of the complex oxide since S5 is 2.65 and S4 is 0.18.

It is possible to confirm that S5 and S6 satisfy an inequality of S5>1.02 S6 from the CPS curve of the complex oxide since S6 is 2.10.

Example 4

Production of Nickel Cobalt Complex Hydroxide

A complex hydroxide is prepared in a manner shown below.

Forming Seed Crystals

The step of forming seed crystals is carried out under a condition similar to that in Example 1 except that the mixed solution containing a nickel sulfate solution, a cobalt sulfate solution and a manganese sulfate solution in a molar ratio of 6:2:2 is prepared.

First Crystallization

A temperature within the vessel is maintained to 25° C. or more until the step of forming seed crystals is completed. The mixed solution in an amount corresponding to the solute of 660 mol and aqueous ammonia are added simultaneously to the reaction vessel to the reaction vessel such that the ammonium ion concentration in the solution is 2000 ppm or more to carry out the step of first crystallization while supplying a sodium hydroxide solution to control pH value in the reaction solution to a range of from 9.5 to 12.0.

Second Crystallization

After the step of first crystallization, the temperature within the vessel is maintained to 25° C. or more. The mixed solution in an amount corresponding to the solute of 540 mol, an ammonium tungstate solution containing tungsten equivalent to 12 mol and aqueous ammonia are added simultaneously to the reaction vessel such that the ammonium ion concentration in the solution is 2000 ppm or more to carry out the step of second crystallization while supplying a sodium hydroxide solution to control pH value in the reaction solution to a range of from 9.5 to 12.0. Then, the product can be washed with water, filtrated and dried to obtain a complex hydroxide.

Analysis of Nickel Cobalt Complex Hydroxide

It is possible to confirm that a composition of the complex hydroxide is $Ni_{0.33}Co_{0.33}Mn_{0.33}W_{0.01}(OH)_{2+a}$, wherein 0≤a≤0.5 by the chemical analysis in a similar manner to that in Example 1.

A cross-section of the secondary particles of the nickel cobalt complex hydroxide is exposed in a similar condition to that in Example 1.

Figure 25:
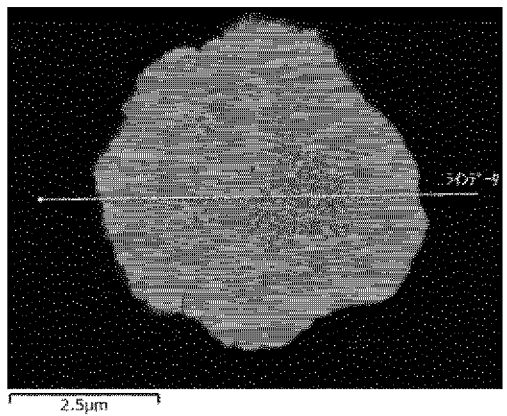
FIG. 25 is a cross-sectional SEM photograph of a nickel cobalt complex hydroxide of Example 4.

It is possible to confirm that the inside of the secondary particles is dense as exemplified in FIG. 25 by SEM observation of the cross-section.

Figure 26:
FIG. 26 is a CPS curve of the nickel cobalt complex hydroxide of Example 4.

It is possible to confirm a peak at the second layer from the obtained CPS curve as exemplified in FIG. 26 by the line analysis of the cross-section with the energy dispersive X-ray analyzer EDX.

It is possible to confirm that S1 and S2 satisfy an inequality of S2>1.02 S1 from the CPS curve since S2 is 2.25 and S1 is 0.88.

It is possible to confirm that S2 and S3 satisfy an inequality of S2>1.02 S3 from the CPS curve since S3 is 0.

Production of Positive Electrode Active Material

Preparation is carried out under a condition similar to that in Example 1.

Analysis of Lithium Transition Metal Complex Oxide

It is possible to confirm that a composition of the lithium transition metal complex oxide is $Li_{1.15}Ni_{0.33}Co_{0.33}Mn_{0.33}W_{0.01}O_2$ by the chemical analysis in a similar manner to that in Example 1.

A cross-section of the secondary particles of the lithium transition metal complex oxide is exposed under a condition similar to that in Example 1.

Figure 27:
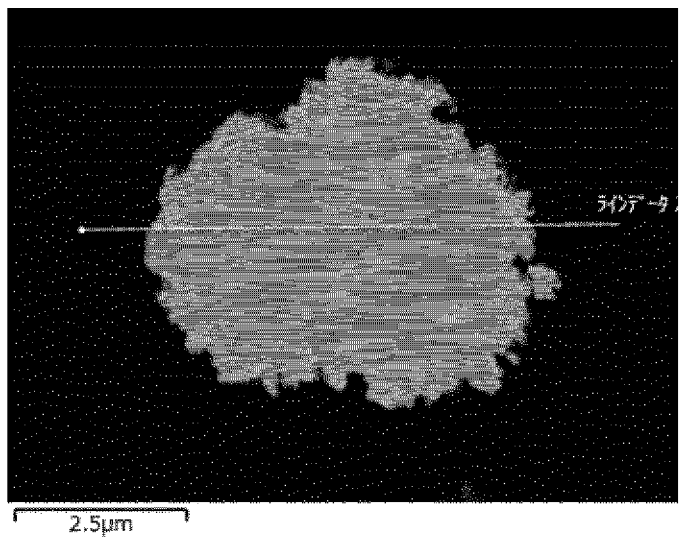
FIG. 27 is a cross-sectional SEM photograph of a lithium transition metal complex oxide of Example 4.

It is possible to confirm the secondary particles have a solid structure as exemplified in FIG. 27 by SEM observation of the cross-section.

Figure 28:
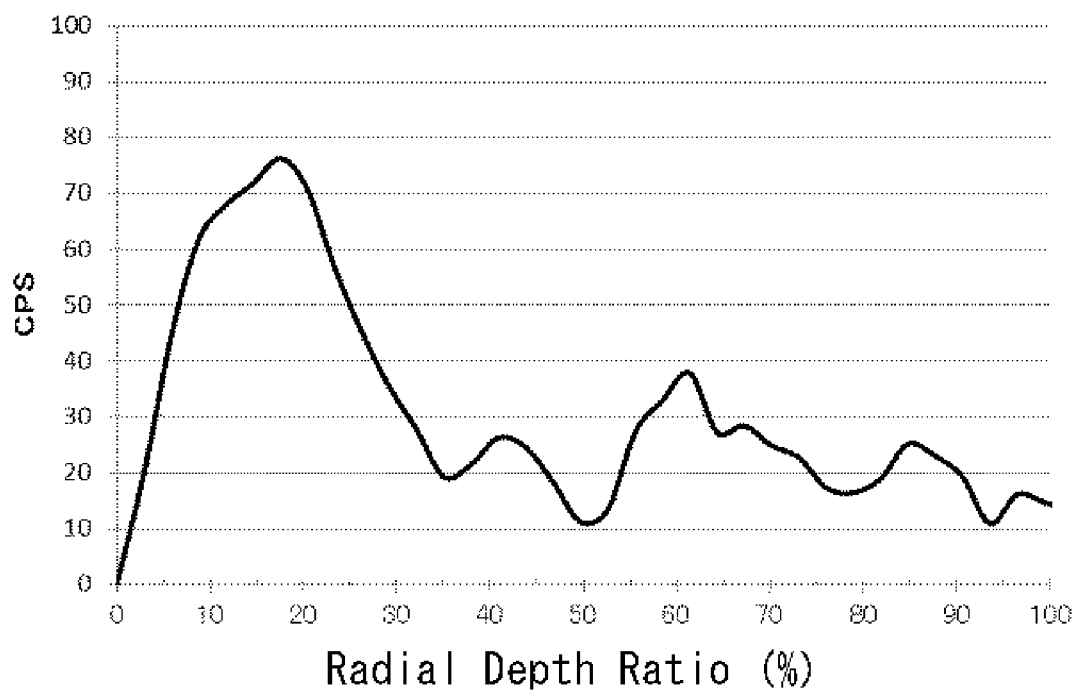
FIG. 28 is a CPS curve of the lithium transition metal complex oxide of Example 4.

It is possible to confirm a peak at the second layer from the obtained CPS curve of the complex oxide as exemplified in FIG. 28 by the line analysis of the cross-section with the energy dispersive X-ray analyzer EDX.

It is possible to confirm that S4 and S5 satisfy an inequality of S5>1.02 S4 from the CPS curve of the complex oxide since S5 is 3.17 and S4 is 1.69.

It is possible to confirm that S2 and S3 satisfy an inequality of S2>1.02 S3 from the CPS curve since S6 is 1.74.

Comparative Example 3

Production of Nickel Cobalt Complex Hydroxide

A complex hydroxide is prepared in a manner shown below.

Forming Seed Crystals

The step of forming seed crystals is carried out under a condition similar to that in Comparative Example 1 except that the mixed solution containing a nickel sulfate solution, a cobalt sulfate solution and a manganese sulfate solution in a molar ratio of 6:2:2 is prepared.

First Crystallization

Preparation is carried out under a condition similar to that in Comparative Example 2.

Second Crystallization

Preparation is carried out under a condition similar to that in Comparative Example 2.

Analysis of Nickel Cobalt Complex Hydroxide

It is possible to confirm that a composition of the complex hydroxide is $Ni_{0.33}Co_{0.33}Mn_{0.33}W_{0.01}(OH)_{2+a}$, wherein 0≤a≤0.5 by the chemical analysis in a similar manner to that in Example 1.

A cross-section of the secondary particles of the nickel cobalt complex hydroxide is exposed in a similar condition to that in Example 1.

Figure 29:
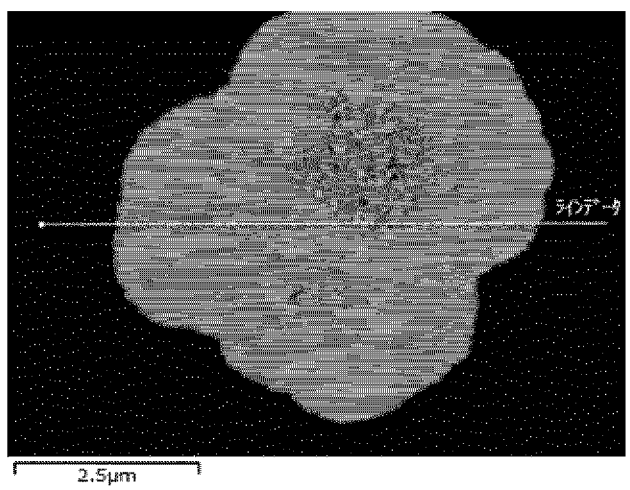
FIG. 29 is a cross-sectional SEM photograph of a nickel cobalt complex hydroxide of Comparative Example 3.

It is possible to confirm that the inside of the secondary particles is dense as exemplified in FIG. 29 by SEM observation of the cross-section.

Figure 30:
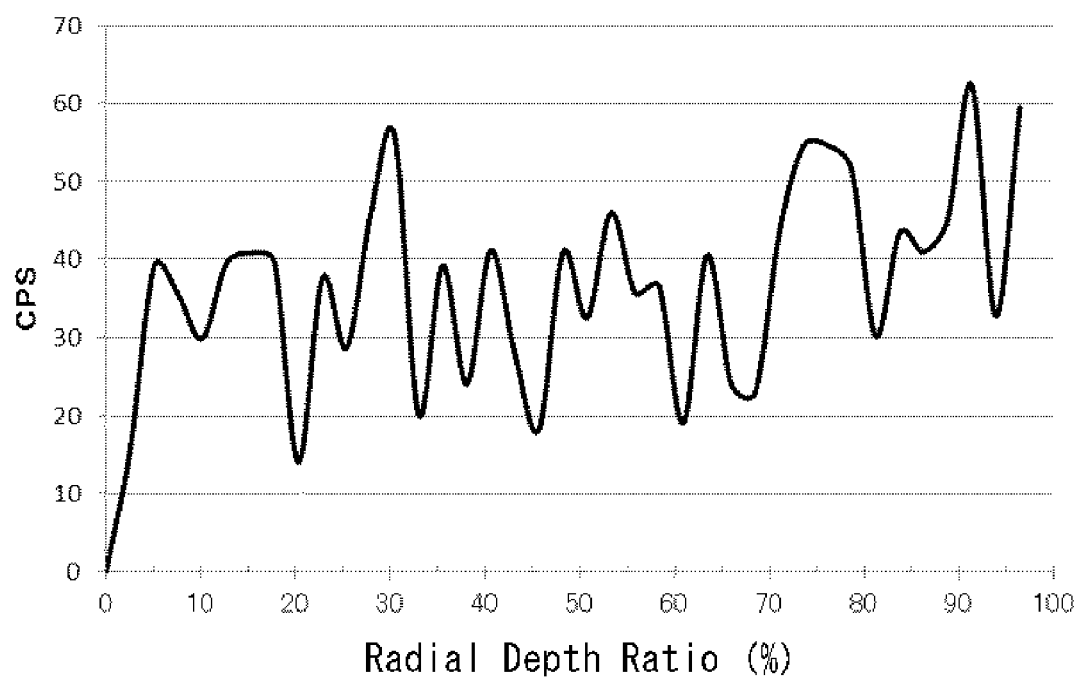
FIG. 30 is a CPS curve of the nickel cobalt complex hydroxide of Comparative Example 3.

It is possible to confirm a peak at the third layer from the obtained CPS curve as exemplified in FIG. 30 by the line analysis of the cross-section with the energy dispersive X-ray analyzer EDX.

It is possible to confirm that S1 and S2 satisfy an inequality of S2>1.02 S1 from the CPS curve since S2 is 2.52 and S1 is 1.35.

It is possible to confirm that S2 and S3 satisfy an inequality of S3>S2 from the CPS curve since S3 is 2.96.

Production of Positive Electrode Active Material

Preparation is carried out under a condition similar to that in Example 1.

Analysis of Lithium Transition Metal Complex Oxide

It is possible to confirm that a composition of the lithium transition metal complex oxide is $Li_{1.15}Ni_{0.33}Co_{0.33}Mn_{0.33}W_{0.01}O_2$ by the chemical analysis in a similar manner to that in Example 1.

A cross-section of the secondary particles of the lithium transition metal complex oxide is exposed under a condition similar to that in Example 1.

Figure 31:
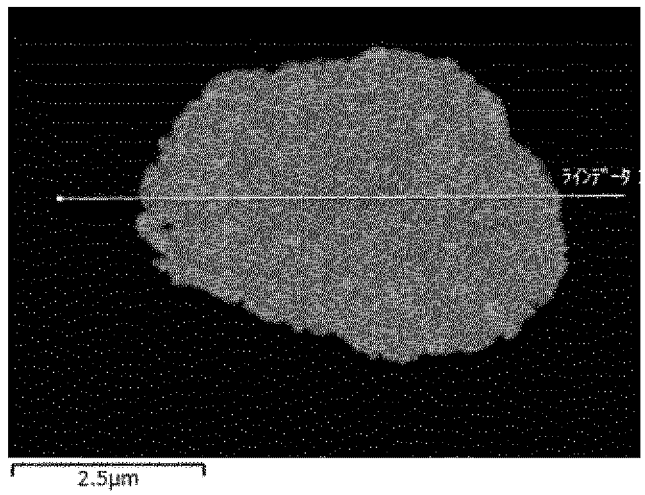
FIG. 31 is a cross-sectional SEM photograph of a lithium transition metal complex oxide of Comparative Example 3.

It is possible to confirm the secondary particles have a solid structure as exemplified in FIG. 31 by SEM observation of the cross-section.

Figure 32:
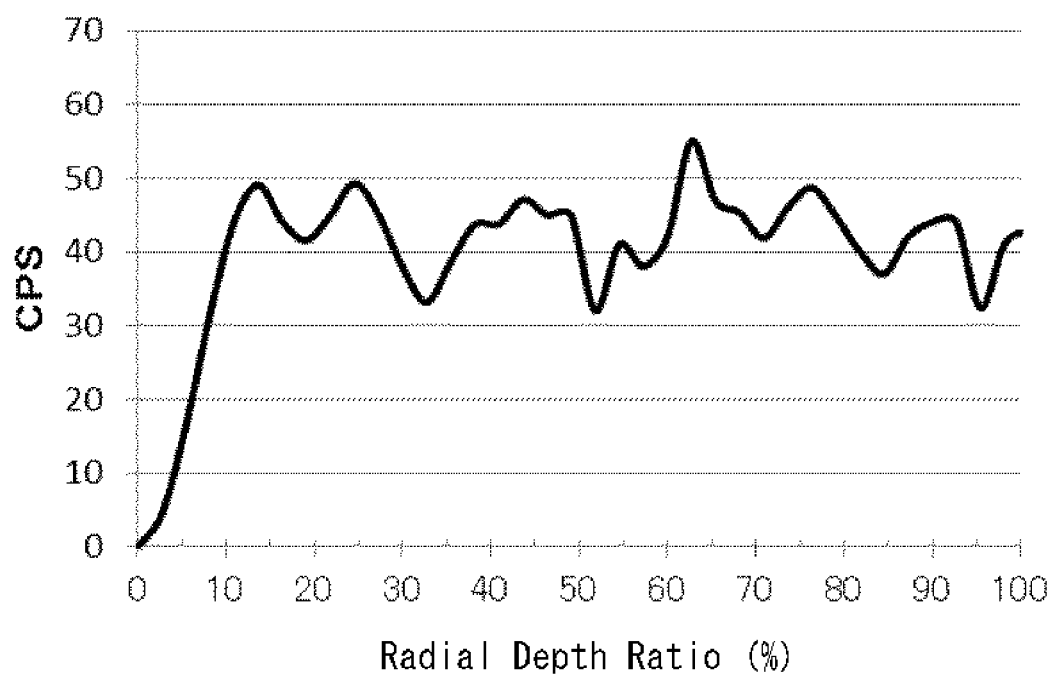
FIG. 32 is a CPS curve of the lithium transition metal complex oxide of Comparative Example 3.

It is possible to confirm a peak at the third layer from the obtained CPS curve of the complex oxide as exemplified in FIG. 32 by the line analysis of the cross-section with the energy dispersive X-ray analyzer EDX.

It is possible to confirm that S4 and S5 satisfy an inequality of S5>1.02 S4 from the CPS curve of the complex oxide since S5 is 3.12 and S4 is 0.52.

It is possible to confirm that S5 and S6 satisfy an inequality of S6>S5 from the CPS curve of the complex oxide since S6 is 3.18.

Preparation of Secondary Battery

A secondary battery for evaluation is prepared in a manner shown below.

Non-Aqueous Electrolytic Solution Secondary Battery

A non-aqueous electrolytic solution secondary battery is prepared by the following procedures.

Preparation of Positive Electrode 85 parts by weight of a positive electrode active material, 10 parts by weight of acetylene black and 5.0 parts by weight of PVDF (polyvinylidene fluoride) were dispersed in NMP (N-methyl-2-pyrrolidone) to prepare positive electrode slurry. The obtained positive electrode slurry is applied to an aluminum foil, dried, and then, compression-molded with a roll press machine and cut off into a predetermined size to obtain a positive electrode.

Preparation of Negative Electrode 97.5 parts by weight of artificial graphite, 1.5 parts by weight of CMC (carboxymethyl cellulose) and 1.0 parts by weight of SBR (styrene-butadiene rubber) were dispersed in water to prepare negative electrode slurry. The obtained negative electrode slurry is applied to a copper foil, dried, and then, compression-molded with the roll press machine and cut off into a predetermined size to obtain a negative electrode.

Preparation of Non-Aqueous Electrolytic Solution

EC (ethylene carbonate) and MEC (methyl ethyl carbonate) were mixed at a volume ratio of 3:7 to be a solvent. Lithium hexafluorophosphate ($LiPF_6$) is dissolved into the obtained mixed solvent such that its concentration is 1 mol/L to obtain a non-aqueous electrolytic solution.

Assembling Battery for Evaluation

Leading electrodes were respectively fixed to current collectors of the positive electrode and the negative electrode, and then, they were vacuum-dried at 120° C. Subsequently, a separator made of porous polyethylene was arranged between the positive electrode and the negative electrode, and they were put in a bag-shaped laminated pack. After that, they were vacuum-dried at 60° C. to remove moisture adsorbed to each member. After vacuum-drying, the above-mentioned non-aqueous electrolytic solution is poured into the laminated pack, and the laminated pack is sealed to obtain a laminate-type non-aqueous electrolytic solution secondary battery.

Solid Electrolyte Secondary Battery

A solid electrolyte secondary battery is prepared by the following procedures.

Preparation of Solid Electrolyte

Lithium sulfide and phosphorus pentasulfide are weighed under an argon atmosphere such that its molar ratio is 7:3. The weighed substances are pulverized and mixed by use of an agate mortar to obtain a sulfide glass. This is used as a solid electrolyte.

Preparation of Positive Electrode 60 parts by weight of the positive electrode active material, 36 parts by weight of the solid electrolyte and 4 parts by weight of VGCF (vapor-grown carbon fiber) are mixed to obtain a positive electrode mixed material.

Preparation of Negative Electrode

An indium foil having a thickness of 0.05 mm is cut out in a circular shape having a diameter of 11.00 mm to be a negative electrode.

Assembling Battery for Evaluation

A columnar lower mold having an outer diameter of 11.00 mm is inserted into a cylindrical external mold having an inner diameter of 11.00 mm from the bottom of the external mold. Upper end of the lower mold is fixed at an intermediate position of the external mold. In this state, 80 mg of the solid electrolyte is put from the upper side of the external mold onto the upper end of the lower mold. After that, a columnar upper mold having an outer diameter of 11.00 mm is inserted from the upper side of the external mold. After insertion, pressure of 90 MPa was applied from the upper side the upper mold to mold the solid electrolyte into a solid electrolyte layer. After molding, the upper mold is pulled out from the upper side of the external mold, and 20 mg of the positive electrode mixed material is put from the upper side of the external mold onto the upper side of the solid electrolyte layer. After that, the upper mold is inserted again, and pressure of 360 MPa is applied in turn to mold the positive electrode mixed material into a positive electrode layer. After molding, the upper mold is fixed, and the fixing of the lower mold is released and pulled out from the lower side of the external mold. Then, the negative electrode is put from the lower side of the lower mold onto the lower side of the solid electrolyte layer. After that, the lower mold is inserted again, and pressure of 150 MPa is applied from the lower side of the lower mold to mold the negative electrode into a negative electrode layer. The lower mold is fixed under pressure. Then, the positive electrode terminal is fixed to the upper mold, and the negative electrode terminal is fixed to the lower mold to obtain an all-solid-state secondary battery.

Evaluation of Battery Characteristics

Battery characteristics are evaluated in a manner shown below by use of the secondary batteries for evaluation.

Non-Aqueous Electrolytic Solution Secondary Battery

Hereinafter, DC-IR is measured for Example 1 and Comparative Examples 1 and 2.

DC-IR

Aging was carried out by applying weak current to the non-aqueous electrolytic solution secondary battery to allow the electrolyte to sufficiently sink into the positive electrode and the negative electrode. Subsequently, discharging with high current and charging with weak current were repeated. Charging capacity at tenth charging is defined as total charging capacity of a battery. After eleventh discharging, charging is carried out to 40% of the total charging capacity. After eleventh charging, the battery is put into a thermostatic chamber in which the temperature is set to −25° C., and left for 6 hours. Subsequently, discharging is carried out at a discharge current of 0.02 A, 0.04 A, 0.06 A to measure a voltage during each discharging. Current and the value of the voltage during the discharging are plotted on the horizontal axis and the vertical axis, respectively, and an absolute value of an inclination of the obtained current-voltage plot is determined within a range where the plot is kept linear to be a resistance R of the battery (−25° C.). Lower value of R (−25° C.) means higher low-temperature output power characteristics.

Solid Electrolyte Secondary Battery

Following characteristics are measured for Example 1 and Comparative Examples 2 and 3.

Initial Charge-Discharge Characteristics

Constant-current/constant voltage charging was carried out at current density of 0.195 μA/cm² and charging voltage of 4.0 V. After charging, constant-current discharging is carried out at current density of 0.195 μA/cm² and discharging voltage of 1.9 V to determine a discharge capacity $Q_d$.

Table 1 shows the results of the ratio of MOL(1) in the step of first crystallization to the total of molar amounts MOL(1) in the step of first crystallization and MOL(2) in the step of second crystallization, low-temperature output power characteristics of the non-aqueous electrolytic solution secondary battery and the discharge capacity of the solid electrolyte secondary battery.

The results of SEM-EDX peaks of the lithium transition metal complex oxides from the nickel cobalt complex oxide particles in Examples 1 to 4, Comparative Examples 1 to 3 are shown in FIGS. 8, 12, 16, 20, 24, 28, 32.

TABLE 1

|  | M(1)/ [M(1) + M(2)] | DC-IR Ω | Qd mAh/g |
|---|---|---|---|
| Example 1 | 0.64 | 11.7 | 112 |
| Example 2 | 0.5 | 11.8 | 101 |
| Example 3 | 0.92 | 11.7 | 104 |
| Example 4 | 0.55 | 10.4 |  |
| Comparative Example 1 | 0 | 12.5 | 98 |
| Comparative Example 2 | 0.17 | 12.8 | 100 |
| Comparative Example 3 | 0.17 | 12.5 |  |

The following matters can be seen from Table 1 and FIGS. 8, 12, 16, 20, 24, 28, 32. It can be said that the non-aqueous electrolytic solution secondary batteries according to Examples 1 to 4 where the lithium transition metal complex oxide having a peak at the second layer as shown in FIG. 8 is used as a positive electrode active material has improved low-temperature output power characteristics compared to Comparative Examples 1 to 3. In addition, it can be said that the solid electrolyte secondary battery has increased discharge capacity compared to Comparative Examples 1 and 2. It is considered that these are because an interfacial resistance between the positive electrode active material and the solid electrolyte is decreased, resulting in suppressed voltage drop inside the battery.

INDUSTRIAL APPLICABILITY

The non-aqueous electrolytic solution secondary battery in which the positive electrode active material obtained by the production method according to the present disclosure is used for the positive electrode has excellent output power characteristics, and can be used suitably as a power source for electric equipment, electric vehicle and the like. In addition, the solid electrolyte secondary battery in which the positive electrode active material obtained by the production method according to the present disclosure is used for the positive electrode has excellent discharge capacity, and can be used suitably as a power source for an electric apparatus such as standby power supply for a power plant which requires high output power in thermally and mechanically harsh environment since it does not comprise a non-aqueous electrolytic solution.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

DENOTATION OF REFERENCE NUMERAL

1 Starting point for measuring secondary particles

The invention claimed is:

1. A nickel cobalt complex hydroxide represented by a formula:
$Ni_{1-x-y}Co_xMn_yM_z(OH)_{2+a}$, wherein $0.10 \leq x \leq 0.35$, $0 \leq y \leq 0.35$, $0 < z \leq 0.05$, $0 \leq a \leq 0.5$, M is at least one element selected from a group consisting of Al, Mg, Ca, Ti, Zr, Nb, Ta, Cr, Mo, W, Fe, Cu, Si, Sn, Bi, Ga, Y, Sm, Er, Ce, Nd, La, Cd and Lu,
wherein the nickel cobalt complex hydroxide is in a form of secondary particles formed by agglomeration of primary particles,
wherein the secondary particles comprises:
a first layer having a radial depth ratio of less than 5% from a surface in the secondary particles;
a second layer having a radial depth ratio in a range of 5% to less than 50% and located at an inner side than the first layer in the secondary particles; and
a third layer having a radial depth ratio of 50% or greater and located at an inner side than the second layer in the secondary particles, and
wherein a SEM-EDX spectrum of said element M with respect to the radial depth in the secondary particles has a peak in the second layer,
wherein the peak includes a point of maximum coordinate value on a vertical axis among peaks in a CPS curve, and
wherein the CPS curve is a plot of a depth ratio in the radial direction to the radius of the secondary particles of the nickel cobalt complex hydroxide on the horizontal axis and fluorescent X-ray intensity at the depth ratio on the vertical axis.

2. The nickel cobalt complex hydroxide according to claim 1, wherein assuming that the amount of said element M in the first layer is S1 and that the amount of said element M in the second layer is S2, S1 and S2 satisfy an inequality of S2>1.02 S1.

3. The nickel cobalt complex hydroxide according to claim 2, wherein assuming that the amount of said element M in the third layer is S3, S2 and S3 satisfy an inequality of S2>1.02 S3.

4. The nickel cobalt complex hydroxide according to claim 1, wherein the secondary particles of the nickel cobalt complex hydroxide have an inner core part made of fine primary particles, and the secondary particles comprise plate-like or needle-like primary particles larger than the fine primary particles outside the inner core part.

5. The nickel cobalt complex hydroxide according to claim 1, wherein the secondary particles of the nickel cobalt complex hydroxide are made of rod-like or plate-like primary particles.

* * * * *